(12) United States Patent
Lee

(10) Patent No.: US 9,378,826 B2
(45) Date of Patent: Jun. 28, 2016

(54) NONVOLATILE MEMORY DEVICE, PROGRAM METHOD THEREOF, AND STORAGE DEVICE INCLUDING THE SAME

(71) Applicant: SAMSUNG ELECTRONICS CO., LTD., Suwon-Si, Gyeonggi-Do (KR)

(72) Inventor: Ji-Sang Lee, Iksan-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/695,866

(22) Filed: Apr. 24, 2015

(65) Prior Publication Data
US 2016/0027513 A1 Jan. 28, 2016

Related U.S. Application Data

(60) Provisional application No. 62/027,807, filed on Jul. 23, 2014.

(30) Foreign Application Priority Data

Mar. 30, 2015 (KR) ........................ 10-2015-0044344

(51) Int. Cl.
*G11C 16/04* (2006.01)
*G11C 16/10* (2006.01)
*G11C 16/24* (2006.01)
*G11C 16/34* (2006.01)

(52) U.S. Cl.
CPC ............ *G11C 16/10* (2013.01); *G11C 16/0483* (2013.01); *G11C 16/24* (2013.01); *G11C 16/3427* (2013.01)

(58) Field of Classification Search
CPC .............. G11C 16/0483; G11C 16/10; G11C 16/3418; G11C 16/3427; G11C 16/26; G11C 16/08; G11C 11/5621; G11C 11/5642; G11C 16/04; G11C 16/24; G11C 16/3404; G11C 16/3454; G11C 16/3459; G11C 16/349
USPC ............. 365/185.17, 185.18, 185.02, 185.22, 365/185.11, 185.28, 185.23, 185.24, 365/185.25, 185.03, 185.05, 185.19, 189.05
See application file for complete search history.

(56) References Cited

U.S. PATENT DOCUMENTS

| | | | |
|---|---|---|---|
| 6,614,688 B2 | 9/2003 | Jeong et al. |
| 7,623,386 B2 | 11/2009 | Dong et al. |
| 7,679,133 B2 | 3/2010 | Son et al. |
| 8,295,091 B2 | 10/2012 | Itagaki et al. |
| 8,320,184 B2 | 11/2012 | Yang et al. |
| 8,427,881 B2 | 4/2013 | Jang et al. |
| 8,493,789 B2 | 7/2013 | Yoon et al. |
| 8,553,466 B2 | 10/2013 | Han et al. |
| 8,559,235 B2 | 10/2013 | Yoon et al. |
| 8,593,871 B2 | 11/2013 | Hemink |
| 8,654,587 B2 | 2/2014 | Yoon et al. |

(Continued)

*Primary Examiner* — Thong Q Le
(74) *Attorney, Agent, or Firm* — Volentine & Whitt, PLLC

(57) ABSTRACT

A nonvolatile memory device includes memory cells stacked in a direction perpendicular to a substrate and further includes a first memory cell string connected between a selected bit line and a selected string selection line, a second memory cell string connected between the selected bit line and an unselected string selection line, and a third memory cell string connected to an unselected bit line. During a bit line setup section of a program operation, a ground voltage is provided to the selected bit line and a power supply voltage provided to the unselected string selection line is changed to the ground voltage.

30 Claims, 21 Drawing Sheets

(56) References Cited

U.S. PATENT DOCUMENTS

| | | | |
|---|---|---|---|
| 2009/0168533 A1* | 7/2009 | Park | G11C 5/02 365/185.17 |
| 2011/0233648 A1 | 9/2011 | Seol et al. | |
| 2013/0208545 A1 | 8/2013 | Lee | |
| 2013/0212076 A1 | 8/2013 | Dean et al. | |
| 2013/0242675 A1 | 9/2013 | Kwak et al. | |

* cited by examiner

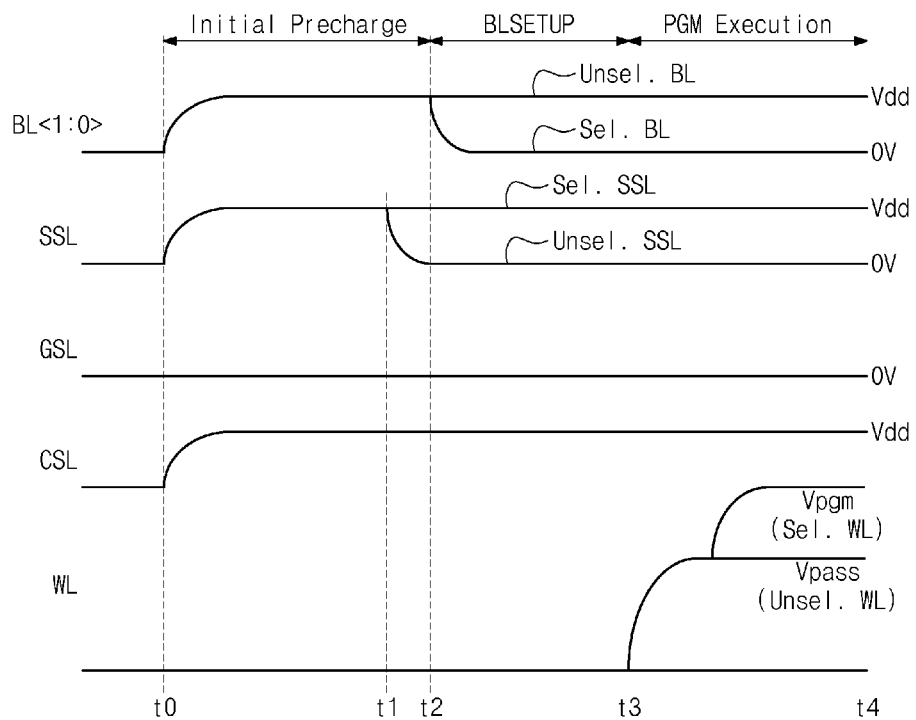

| BL \ SSL | Select | Unselect |
|---|---|---|
| Select (PGM) | 0V | 0V |
| Unselect (Inhibit) | Vdd-Vth | Vdd-Vth |

US 9,378,826 B2

NONVOLATILE MEMORY DEVICE, PROGRAM METHOD THEREOF, AND STORAGE DEVICE INCLUDING THE SAME

CROSS-REFERENCE TO RELATED APPLICATIONS

A claim for priority under 35 U.S.C. §119 is made to U.S. Patent Provisional Application No. 62/027,807 filed Jul. 23, 2014, in the U.S. Patent and Trademark Office, and Korean Patent Application No. 10-2015-0044344 filed Mar. 30, 2015, in the Korean Intellectual Property Office, the entire contents of which are hereby incorporated by reference.

BACKGROUND

Embodiments of the application described herein relate to a semiconductor memory device, and more particularly, relate to a nonvolatile memory device having a three-dimensional structure and a program method thereof.

Semiconductor memory devices are classified into volatile memory devices such as a DRAM, an SRAM, etc. and nonvolatile memory devices such as an EEPROM, a FRAM, a PRAM, an MRAM, a flash memory, etc. The volatile memory devices lose data stored therein at power-off, but the nonvolatile memory devices retain data stored therein even at power-off. In particular, the flash memory has merits such as fast program speed, low power consumption, storage of a large amount of data, etc. Thus, a flash memory system including the flash memory is widely used as a data storage medium.

The degree of integration of the flash memory is being increased to maintain excellent performance and a competitive price. However, a conventional two-dimensional flash memory has limits to increase the degree of integration due to a manufacturing process. A three-dimensional flash memory is being developed to overcome such limits.

The three-dimensional flash memory makes the degree of integration high, but its data reliability is decreased due to program disturbance or interference coupling between cells during a program operation. In particular, the data reliability may become more problematic when data of two or more bits is stored at a memory cell.

SUMMARY

Embodiments of the application provide a nonvolatile memory device and a program method capable of adjusting a voltage to be provided at a page program operation using a program voltage manager, thereby minimizing a decrease in data reliability due to program disturbance.

One aspect of embodiments of the application is directed to provide a nonvolatile memory device which includes memory cells stacked in a direction perpendicular to a substrate, the nonvolatile comprising a first memory cell string connected to a selected bit line and a selected string selection line; a second memory cell string connected to the selected bit line and an unselected string selection line; and a third memory cell string connected to an unselected bit line. Wherein during a bit line setup section of a program operation, a bit line program voltage is applied to the selected bit line and a turn-on voltage provided to the unselected string selection line is changed to a turn-off voltage.

Another aspect of embodiments of the application is directed to provide a program method of a nonvolatile memory device which includes a first memory cell string connected to a selected bit line and a selected string selection line; a second memory cell string connected to the selected bit line and an unselected string selection line; and a third memory cell string connected to an unselected bit line. The program method comprises: performing a first bit line setup of a program operation in at least one program loop among a plurality of program loops. During the first bit line setup, a bit line program voltage is applied to the selected bit line and a turn-on voltage provided to the unselected string selection line is changed to a turn-off voltage. A second bit line setup of the program operation is performed in at least one other program loop among the plurality of program loops. During the second bit line setup of the program operation, a precharge voltage is applied to the selected bit line and the unselected bit line, the turn-on voltage is applied to the selected string selection line and the unselected string selection line, and then the turn-off voltage is applied to the unselected string selection line and the selected bit line.

Another aspect of embodiments of the application is directed to provide a program method of a nonvolatile memory device which includes a first memory cell string connected to a selected bit line and a selected string selection line; a second memory cell string connected to the selected bit line and an unselected string selection line; and a third memory cell string connected to an unselected bit line. The program method comprises: performing a bit line setup of a program operation in at least one program loop among a plurality of program loops. During the bit line setup, a bit line program voltage is applied to the selected bit line and a turn-on voltage provided to the unselected string selection line is changed to the turn-off voltage.

The nonvolatile memory device comprises a word line electrically connected to selected memory cells. During the bit line setup, a voltage of the unselected string selection line is discharged to a ground voltage before a program voltage is applied to the word line. And during the bit line setup, the bit line program voltage applied to the selected bit line is maintained to a ground voltage before a program voltage is applied to the word line.

The program method further comprises: performing a second bit line setup of the program operation in another program loop among the plurality of program loops. Wherein during the second bit line setup, the turn-on voltage is applied to the selected string selection line and the unselected bit line and the turn-off voltage is applied to the unselected string selection line and the selected bit line.

Another aspect of embodiments of the application is directed to provide a storage device comprising a nonvolatile memory device including a first memory cell string connected between a selected bit line and a selected string selection line, a second memory cell string connected between the selected bit line and an unselected string selection line, and a third memory cell string connected to an unselected bit line. A memory controller is configured to control the nonvolatile memory device. The nonvolatile memory device performs a bit line setup of a program operation in at least one program loop among a plurality of program loops. During the bit line setup, a bit line program voltage is provided to the selected bit line and a turn-on voltage provided to the unselected string selection line is changed to the turn-off voltage.

A further aspect of embodiments of the application is directed to provide a memory device having an array of nonvolatile memory cells, each of the memory cells being programmed according to signals received on a selected one of a plurality of bit lines, a selected one of a plurality of string-select lines, and a selected one of a plurality of word lines. A voltage generator applies voltages to the plurality of bit lines, string-select lines, and word lines. The voltage generator pre-charges the selected and unselected string-select lines to a turn-on voltage of the string-select lines. After pre-charging the selected and unselected string-select lines to the turn-on voltage, the voltage generator applies a turn-off voltage to the unselected string-select lines for turning-off the unselected string-select lines and continues to apply the turn-on voltage to the selected string-select line during a bit-line setup period and a programming period. Upon completing the bit-line setup period, the voltage generator applies a programming voltage, during the programming period, to the selected word line and thereby programs a selected memory cell addressed by the selected string-select line, the selected word line, and the selected bit line.

A further aspect of embodiments of the application is directed to provide a method, executed by a memory controller, of programming a memory device having an array of nonvolatile memory cells. Each of the memory cells is programmed according to signals received on a selected one of a plurality of bit lines, a selected one of a plurality of string-select lines, and a selected one of a plurality of word lines. The method includes receiving an address and data from a host device; identifying the selected bit line, string-select line, and word line for programming a memory cell corresponding to the received address; identifying a programming voltage corresponding to the received data for programming the memory cell; pre-charging the selected and unselected string-select lines to a turn-on voltage of the string-select lines; applying, after pre-charging the selected and unselected string-select lines to the turn-on voltage, a turn-off voltage to the unselected string-select lines for turning-off the unselected string-select lines and continuing to apply the turn-on voltage to the selected string-select line during a bit-line setup period and a programming period; and applying, upon completing the bit-line setup period, the programming voltage, during the programming period, to the selected word line so as to program the memory cell addressed by the selected string-select line, the selected word line, and the selected bit line.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 7 is a table illustrating voltage conditions at a program operation of a flash memory device according to an exemplary embodiment of the application;

FIG. 8 is a timing diagram schematically illustrating a program operation of a flash memory device shown in FIG. 6;

DETAILED DESCRIPTION

Figure 1:
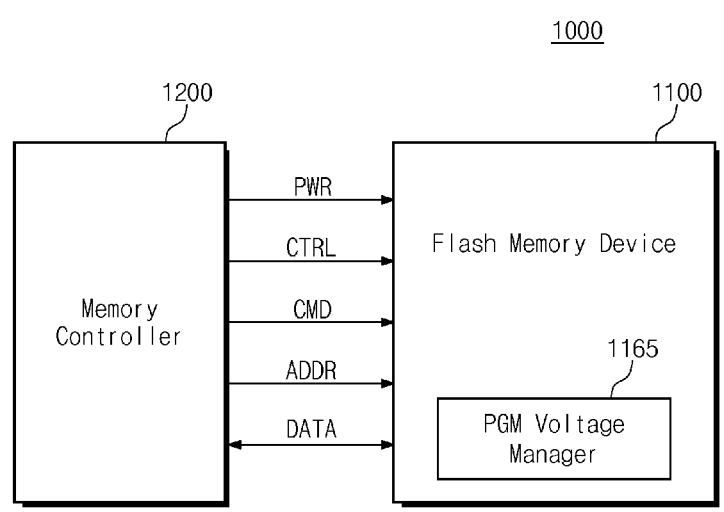
FIG. 1 is a block diagram schematically illustrating a flash memory system according to an exemplary embodiment of the application.

Embodiments will be described in detail with reference to the accompanying drawings. The application, however, may be embodied in various different forms, and should not be construed as being limited only to the illustrated embodiments. Rather, these embodiments are provided as examples so that this disclosure will be thorough and complete, and will fully convey the concept of the application to those skilled in the art. Accordingly, known processes, elements, and techniques are not described with respect to some of the embodiments of the application. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the application.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In an embodiment of the present application, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present application, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram schematically illustrating a flash memory system according to an exemplary embodiment of the application. Referring to FIG. 1, a flash memory system 1000 comprises a flash memory device 1100 and a memory controller 1200. The flash memory system 1000 may include all flash memory-based data storage media such as a memory card, a USB memory, a solid state drive (SSD), etc.

The flash memory device 1100 performs operations, including an erase operation, a write operation, and a read operation, according to control of the memory controller 1200. The flash memory device 1100 receives a command CMD, an address ADDR, and data DATA through input/output lines. The flash memory device 1100 receives power PWR through a power line and a control signal CTRL through a control line. The control signal CTRL may include a command latch enable signal CLE, an address latch enable signal ALE, a chip enable nCE, a write enable nWE, a read enable nRE, etc.

The flash memory device 1100 includes a program voltage manager 1165. The program voltage manager 1165 adjusts a voltage(s) to be provided (or needed) during a program operation of the flash memory device 1100.

In contrast, the program voltage manager 1165 may be included in the memory controller 1200. In this case, the program voltage manager 1165 may be managed by a Flash Translation Layer (FTL). The flash memory system 1000 according to an exemplary embodiment of the application reduces program disturbance at a program operation using the program voltage manager 1165, thereby improving the reliability of the flash memory device 1100.

Figure 2:
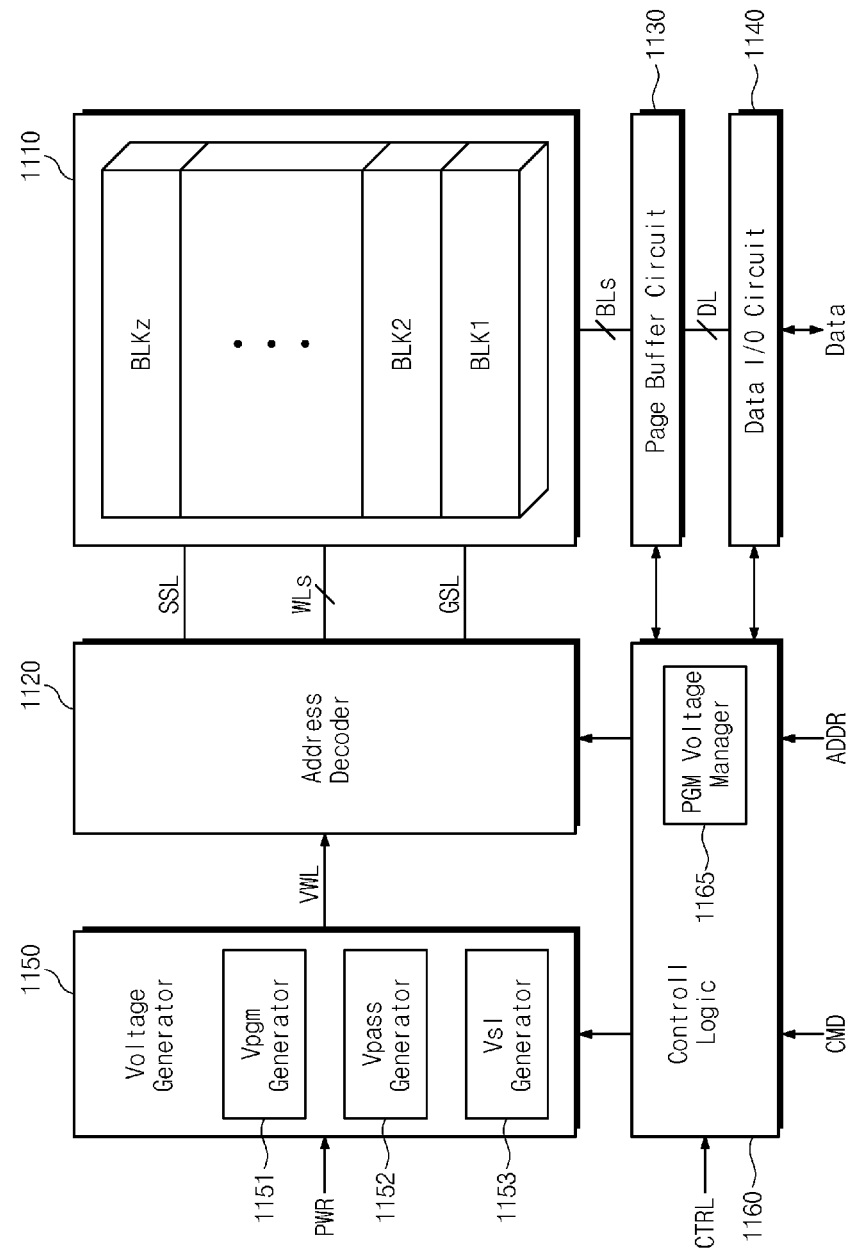
FIG. 2 is a block diagram schematically illustrating a flash memory device shown in FIG. 1, according to an embodiment of the application.

FIG. 2 is a block diagram schematically illustrating a flash memory device shown in FIG. 1, according to an embodiment of the application. Referring to FIG. 2, a flash memory device 1100 contains a memory cell array 1110, an address decoder 1120, a page buffer circuit 1130, a data input/output circuit 1140, a voltage generator 1150, and control logic 1160. The control logic 1160 includes a program voltage manager 1165. The program voltage manager 1165, as described above, may adjust a voltage(s) to be provided at a program operation.

The memory cell array 1110 includes a plurality of memory blocks BLK1 to BLKz, each of which has a three-dimensional structure (or a vertical structure). A memory block having a two-dimensional structure (or a horizontal structure) includes memory cells formed in a direction parallel with a substrate.

In contrast, a memory block having the three-dimensional structure includes memory cells formed in a direction perpendicular to the substrate. Each memory block may correspond to an erase unit of the flash memory device 1100. However, it may be apparent that the erase unit may not be limited to a memory block.

The address decoder 1120 is connected to the memory cell array 1110 through selection lines SSL and GSL and word lines WLs. The address decoder 1120 receives a word line voltage VWL from the voltage generator 1150 and operates in response to a control of the control logic 1160. The address decoder 1120 selects a word line at a read or program operation. A program voltage or a read voltage may be applied to the selected word line.

The page buffer circuit 1130 is connected to the memory cell array 1110 through bit lines BLs. A page buffer may be connected with a bit line (All BL structure) or with two or more bit lines (Shield BL structure). The page buffer circuit 1130 temporarily stores data to be programmed at or data read out from a selected page.

The data input/output circuit 1140 is connected to the page buffer circuit 1130 through data lines DL. Further, the data input/output circuit 1140 is connected to a memory controller 1200 (refer to FIG. 1) through input/output Data lines. The data input/output circuit 1140 receives program data Data from the memory controller 1200 at a program operation and provides read data Data to the memory controller 1200 at a read operation.

The voltage generator 1150 receives power PWR from the memory controller 1200 to generate the word line voltage VWL needed to read or write data. The word line voltage VWL is provided to the address decoder 1120. The voltage generator 1150 generates a high voltage higher than a power supply voltage Vdd. The high voltage may be used as a program voltage Vpgm or a pass voltage Vpass, etc.

Continuing to refer to FIG. 2, the voltage generator 1150 includes a program voltage (Vpgm) generator 1151, a pass voltage (Vpass) generator 1152, and a selection line voltage (Vsl) generator 1153. The program voltage generator 1151 generates a program voltage Vpgm to be provided to a selected word line at a program operation. The program voltage Vpgm may be increased as program loops are iterated. The pass voltage generator 1152 generates a pass voltage Vpass to be applied to selected and unselected word lines at the program operation. In general, the pass voltage Vpass is constantly maintained even though program loops are iterated. The selection line voltage generator 1153 generates a selection line voltage Vsl to be applied to a string selection line SSL or a ground selection line GSL.

The control logic 1160 may control program, read, and erase operations of the flash memory device 1100 using a command CMD, an address ADDR, and a control signal CTRL.

For example, at the program operation, the control logic 1160 may control the address decoder 1120 to provide the program voltage Vpgm to a selected word line and the page buffer circuit 1130 and the data input/output circuit 1140 to provide program data to a selected page.

The control logic 1160 includes the program voltage manager 1165. The program voltage manager 1165 may determine a voltage(s) to be applied to a string selection line(s) and a bit line(s) in performing a program operation. Unlike the above description, the program voltage manager 1165 may be independently placed outside the control logic 1160.

In exemplary embodiments, the program voltage manager 1165 may manage the following operations at a program operation. A power supply voltage is applied to a string selection line(s) and an unselected bit line(s), and a ground voltage (e.g., 0V) is applied to a selected bit line(s). The power supply voltage of an unselected string selection line(s) is discharged to the ground voltage (e.g., 0V), and a program voltage is provided to a selected word line. Alternatively, a first voltage higher than the power supply voltage may be applied to an unselected string selection line(s) under a control of the program voltage manager 1165. The first voltage may be a voltage sufficient to turn on a string selection transistor.

Under a control of the program voltage manager 1165, the first voltage of an unselected string selection line(s) is discharged to a second voltage, and the program voltage is provided to the selected word line. The second voltage may be a ground voltage or a voltage sufficient to turn off the string selection transistor. Since the power supply voltage or the first voltage is provided to an unselected string selection line(s), program disturbance and error occurrence probability are reduced at a program operation, thereby improving data reliability.

In other exemplary embodiments, when a nonvolatile memory device deteriorates, the program voltage manager 1165 may manage the following operations. The power supply voltage is applied to all string selection lines and all bit lines, and voltages of an unselected string selection line(s) and a selected bit line(s) are discharged to the ground voltage (e.g., 0 V). In this case, the discharging of voltages of the unselected string selection line(s) and the selected bit line(s) may cause a delay of a program time and an increase in current consumption. This will be more fully described with reference to FIGS. 6 to 11.

Figure 3:
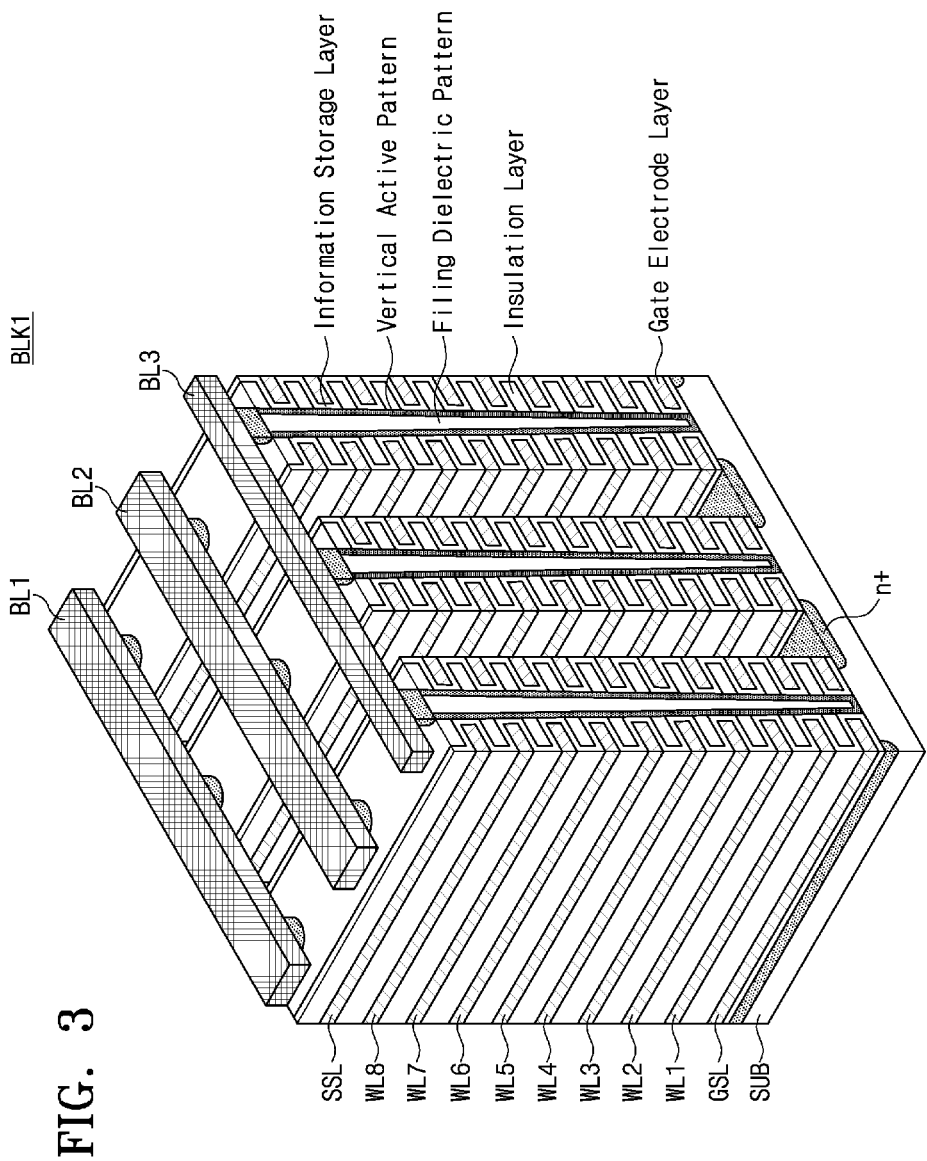
FIG. 3 is a perspective view schematically illustrating a three-dimensional structure of a memory block illustrated in FIG. 2.

FIG. 3 is a perspective view schematically illustrating a three-dimensional structure of a memory block BLK1 illustrated in FIG. 2. Referring to FIG. 3, a memory block BLK1 is formed in a direction perpendicular to a substrate SUB. An n+ doping region is formed in the substrate SUB. A gate electrode layer and an insulation layer are deposited above the substrate SUB in turn.

An information storage layer is formed between the gate electrode layers and the insulation layers. The information storage layer includes a tunnel insulation layer, a charge storage layer, and a blocking insulation layer.

V-shaped pillars are formed when the gate electrode layers and the insulation layers are patterned in a vertical direction. The pillars are in contact with the substrate SUB via the gate electrode layers and the insulation layers. In each pillar, an outer portion may be a vertical active pattern and be formed of channel semiconductor, and an inner portion may be a filling dielectric pattern and be formed of an insulation material such as silicon oxide.

Continuing to refer to FIG. 3, the gate electrode layers of the memory block BLK1 may be connected with a ground selection line GSL, a plurality of word lines WL1 to WL8, and a string selection line SSL. The pillars of the memory block BLK1 are connected with a plurality of bit lines BL1 to BL3. In FIG. 3, an embodiment of the application is exemplified as one memory block BLK1 has two selection lines SSL and GSL, eight word lines WL1 to WL8, and three bit lines BL1 to BL3. However, the scope and spirit of the application may not be limited thereto.

Figure 4:
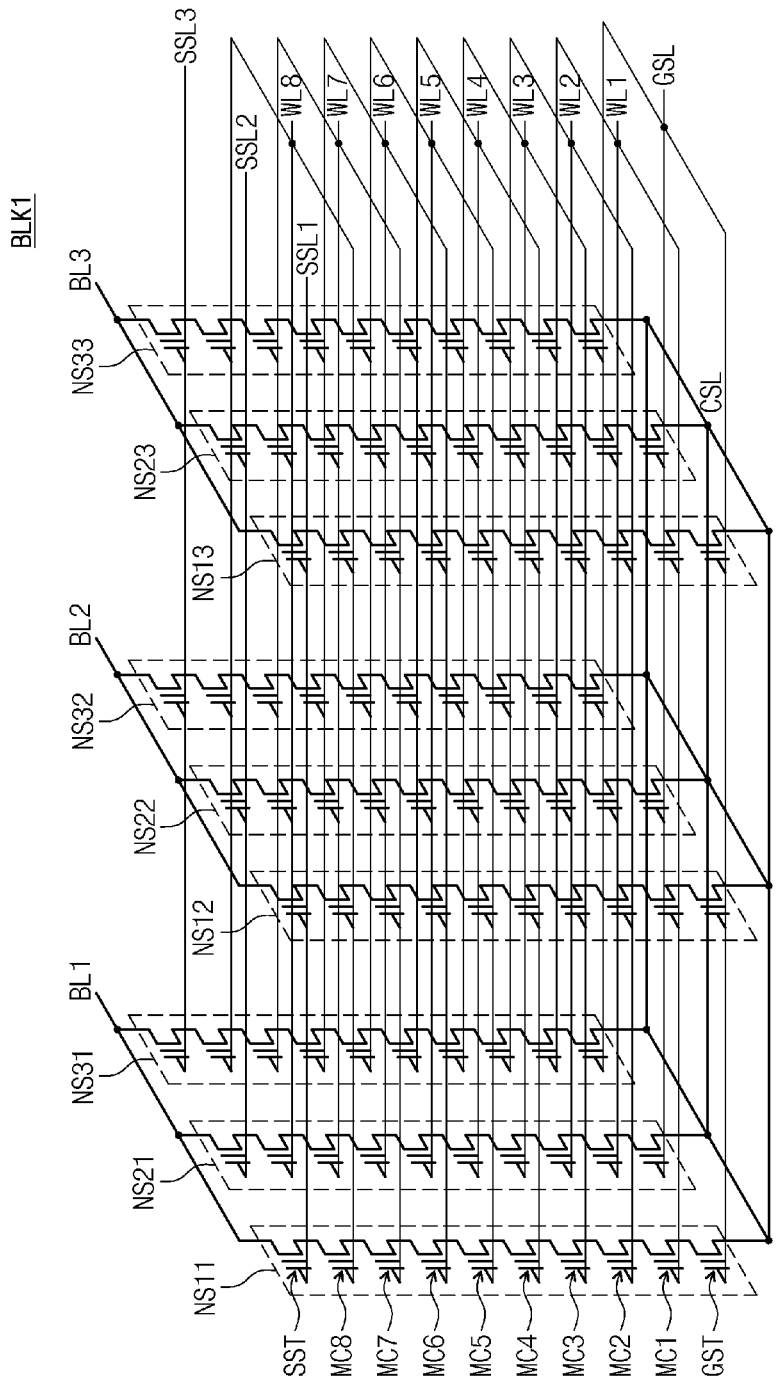
FIG. 4 is an equivalent circuit of a memory block illustrated in FIG. 3.

FIG. 4 is an equivalent circuit of a memory block BLK1 illustrated in FIG. 3.

Referring to FIG. 4, NAND strings NS11 to NS33 are connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected with string selection lines SSL1 to SSL3. The memory cells MC1 to MC8 are connected with corresponding word lines WL1 to WL8, respectively. The ground selection transistors GST are connected with a ground selection line GSL. In each cell string, the string selection transistor SST is connected with a bit line, and the ground selection transistor GST is connected with the common source line CSL.

Continuing to refer to FIG. 4, the string selection lines SSL1 to SSL3 are separated. Word lines (e.g., WL1) having the same height may be connected in common. A first word line WL1, a first string selection line SSL1, and a first bit line BL1 are selected to program selected memory cells connected with the first word line WL1 and belonging to the NAND strings NA11, NS12, and NS13.

Referring to FIGS. 2 to 4, a program voltage manager 1165 may decide a voltage to be provided to a string selection line and a bit line at a program operation. In some embodiments, the program voltage manager 1165 may allow a ground voltage to be provided to a selected bit line and a power supply voltage to be applied to an unselected bit line.

In exemplary embodiments, a selected string selection line and an unselected string selection line may be respectively connected to a first string selection transistor and a second string selection transistor, and a power supply voltage may be applied to the selected string selection line and the unselected string selection line. The program voltage manager 1165 may discharge an unselected string selection line from the power supply voltage to the ground voltage and provide the program voltage to a selected word line. A memory cell string between the unselected string selection line and a selected bit line may have an initial channel potential corresponding to a difference between the power supply voltage and a threshold voltage of the first string selection transistor.

In other exemplary embodiments, the program voltage manager 1165 may provide a selected string selection line and an unselected string selection line with a first voltage that is higher than the power supply voltage and is sufficient to turn on a string selection transistor. The program voltage manager 1165 may discharge the unselected string selection line from the first voltage to the second voltage and provide the program voltage to the selected word line. The second voltage may be a voltage sufficient to turn off an unselected string selection transistor. A memory cell string between an unselected string selection line and a selected bit line may have an initial channel value corresponding to a relatively small one of a difference between the power supply voltage and a threshold voltage of the second string selection transistor and a difference between the first voltage and the threshold voltage of the second string selection transistor.

One memory cell may store 1-bit data or M-bit data (M being an integer of two or more). A memory cell where 1-bit data is stored is referred to as "Single Level Cell (SLC)" or "Single Bit Cell", and a memory cell where multi-bit data is stored is referred to as "Multi Level Cell (MLC)" or "Multi Bit Cell". For example, a 2-bit memory cell may store lower bit data and upper bit data, and a 3-bit memory cell may store LSB data, CSB data, and MSB data.

Figure 5:
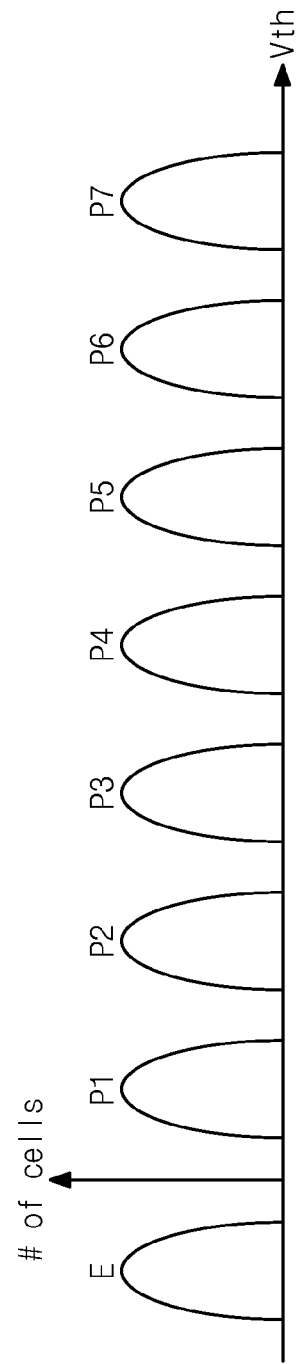
FIG. 5 is a diagram schematically illustrating a threshold voltage variation of a 3-bit memory cell.

FIG. 5 is a diagram schematically illustrating a threshold voltage variation of a 3-bit memory cell. In FIG. 5, the abscissa represents a threshold voltage Vth, and the ordinate represents the number of memory cells. A 3-bit memory cell has one of eight states E and P1 to P7 according to a threshold voltage distribution. Here, "E" represents an erase state, and "P1" to "P7" represent program states.

A flash memory device 1100 (refer to FIG. 2) simultaneously programs memory cells connected with a word line. This program operation is referred to as "page program". In a 3-bit flash memory device, a page program operation is performed three times with respect to a word line. Below, it is assumed that a first page program operation, a second page program operation, and a third page program operation are referred to as "LSB page program operation", "CSB page program operation", and "MSB page program operation" respectively.

A flash memory having a cell string structure formed in a direction perpendicular to a substrate may suffer program disturbance between program-inhibited strings. To program a selected memory cell, a program voltage Vpgm is applied to a selected word line under the condition that a power supply voltage is applied to a selected string selection line and a ground voltage is applied to a selected bit line. In this case, a channel of a selected cell string may be set to a ground voltage level.

A channel of a first program-inhibited string connected with a selected word line, a selected string selection line, and an unselected bit line may be pre-charged to have a voltage of (Vdd-Vth) at an initial state, so a string selection transistor may be shut off. Afterwards, the channel of the first program-inhibited string may be boosted. Here, "Vth" is a threshold voltage of a string selection transistor.

After set up to a ground voltage at an initial state, channels of second and third program-inhibited strings start to be boosted. Here, the second program-inhibited string is connected with the selected word line, an unselected string selection line, and the selected bit line, and the second program-inhibited string is connected with the selected word line, the unselected string selection line, and the unselected bit line. Accordingly, the channels of the second and third program-inhibited strings start to be boosted at an initial state different from a channel of the first program-inhibited string.

As described above, since initial channel voltage levels of the second and third program-inhibited strings are lower than that of the first program-inhibited string, program disturbance may occur, thereby making it difficult to secure a pass voltage window.

The application may provide various methods for solving a problem due to a difference between initial voltage levels of program-inhibited strings. For example, the application may reduce (or minimize) program disturbance by pre-charging channels of all program-inhibited strings with (Vdd-Vth).

Figure 6:
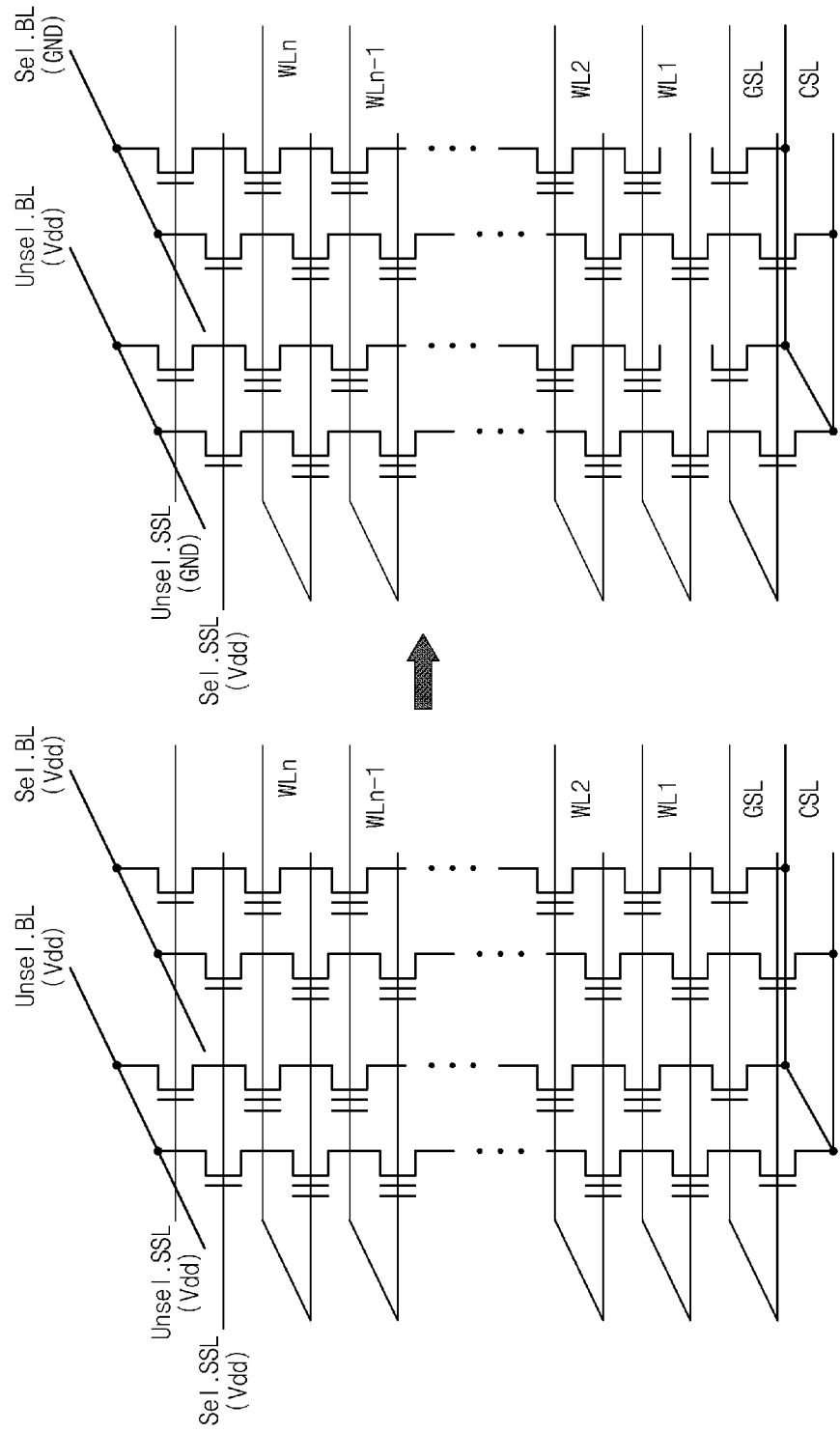
FIG. 6 is a diagram for describing a program operation of a flash memory device according to an exemplary embodiment of the application.

FIG. 6 is a diagram for describing a program operation of a flash memory device according to an exemplary embodiment of the application, and FIG. 7 is a table illustrating voltage conditions at a program operation of a flash memory device according to an exemplary embodiment of the application. In FIGS. 6 and 7, there is illustrated an embodiment where channels of all program-inhibited strings are pre-charged with (Vdd-Vth).

Referring to FIG. 6, a power supply voltage Vdd is applied to selected and unselected string selection lines, and a pre-charge voltage (e.g., a power supply voltage Vdd) is supplied to selected and unselected bit lines. According to this voltage condition, string selection transistors are shut off, and channels of all program-inhibited strings are pre-charged with (Vdd-Vth). To boost channels, the string selection transistors may be turned off by lowering a voltage of an unselected string selection line from Vdd to GND. At this time, initial pre-charge levels of the channels may remain at (Vdd-Vth).

Next, a selected string selection line maintains Vdd, and a voltage of a selected bit line is lowered from Vdd to GND. According to this voltage condition, a channel voltage of a program string is lowered from (Vdd-Vth) to GND. Afterwards, when a program voltage Vpgm is applied to a selected word line, a selected memory cell is programmed, with an unselected memory cell program-inhibited.

A flash memory device according to an exemplary embodiment of the application sets initial channel voltage levels of first to third program-inhibited strings to (Vdd-Vth), thereby preventing program disturbance due to a difference between initial voltage levels of program-inhibited strings.

FIG. 8 is a timing diagram schematically illustrating a program operation of a flash memory device shown in FIG. 6. Referring to FIG. 8, a program operation is divided into an initial pre-charge section, a bit line setup section, and a program execution section.

In a first interval t0 to t1 of the initial pre-charge section, a power supply voltage Vdd is applied to a selected bit line, an unselected bit line, a selected string selection line, and an unselected string selection line. A ground voltage GND is applied to a ground selection line GSL, and the power supply voltage Vdd is provided to a common source line CSL. According to this voltage condition, all strings are pre-charged with (Vdd-Vth). At this time, strings (or string selection transistors thereof) connected with the selected string selection line are shut off.

In a second interval t1 to t2 of the initial pre-charge section, the selected string selection line maintains the power supply voltage Vdd, and a voltage of the unselected string selection line is discharged from Vdd to GND. According to this voltage condition, a program-inhibited string(s) may be electrically isolated from a bit line(s).

In the bit line setup section t2 to t3, the ground voltage GND is applied to the selected bit line, while the unselected bit line maintains the power supply voltage Vdd. In the program execution section t3 to t4, a pass voltage Vpass is provided to all word lines, so channels of program-inhibited strings electrically shut off are boosted. Afterwards, a program voltage Vpgm is provided to the selected word line to program selected memory cells connected with the selected word line.

In a program method described with reference to FIGS. 6 to 8, channels of all strings are pre-charged with (Vdd-Vth) in the initial pre-charge section. Hence, the program method of the application may set channels of program-inhibited strings with the same initial channel voltage, thereby reducing program disturbance.

Figure 9:
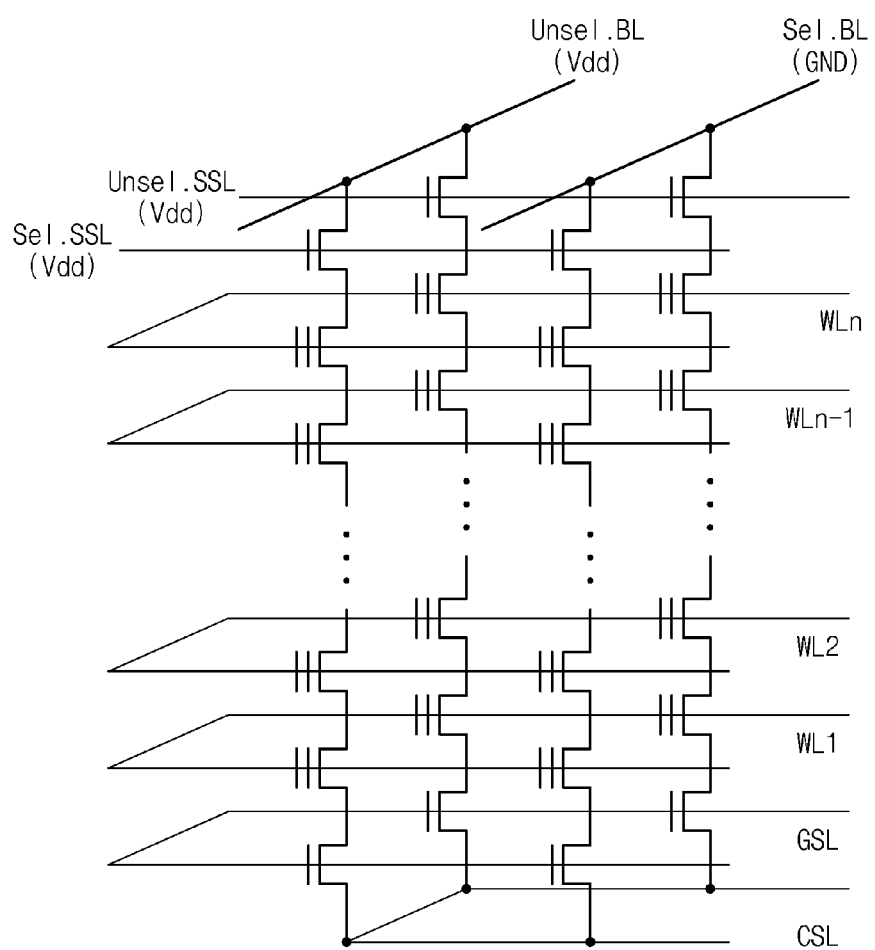
FIG. 9 is a diagram for describing a program operation of a flash memory device according to another exemplary embodiment of the application.
Figures 10, 11:
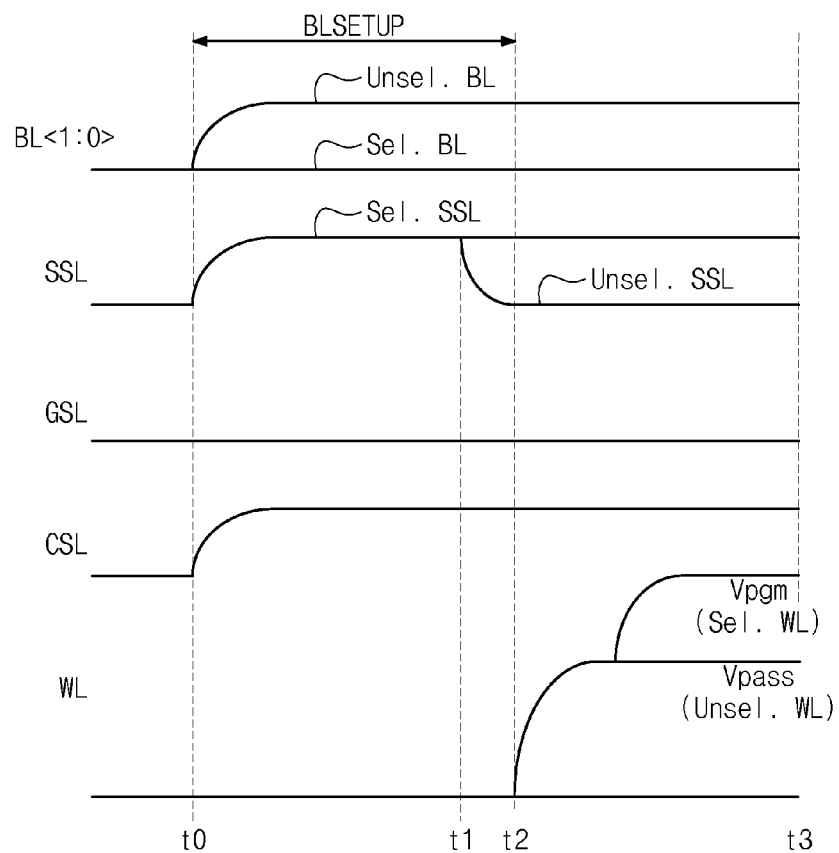
FIG. 10 is a table illustrating voltage conditions at a program operation of a flash memory device according to another exemplary embodiment of the application.
FIG. 11 is a timing diagram schematically illustrating a program operation of a flash memory device shown in FIG. 9.

FIG. 9 is a diagram for describing a program operation of a flash memory device according to another exemplary embodiment of the application, and FIG. 10 is a table illustrating voltage conditions at a program operation of a flash memory device according to another exemplary embodiment of the application. Unlike a program method of FIG. 6, a program method of FIG. 9 may apply a power supply voltage Vdd to an unselected bit line and a ground voltage GND to a selected bit line, as like a general program method Referring to FIG. 9, a power supply voltage Vdd is provided to selected and unselected string selection lines, the ground voltage GND is applied to the selected bit line, and the power supply voltage Vdd is applied to the unselected bit line. At this time, as illustrated in FIG. 10, a channel voltage of a string connected with the selected bit line is the ground voltage GND or 0 V, and a channel voltage of a string connected with the unselected bit line is (Vdd-Vth).

Referring to FIG. 9, a voltage provided to selected and unselected string selection lines is illustrated as being the power supply voltage Vdd, for the sake of description. However, a first voltage higher than the power supply voltage Vdd may be provided to the selected and unselected string selection lines. In other words, the first voltage may be a voltage that is higher than the power supply voltage Vdd and is sufficient to turn on a string selection transistor.

To boost channels at a program operation, a voltage of an unselected string selection line is discharged to a second voltage (e.g., a ground voltage GND). Here, the second voltage may be a voltage that is sufficient to turn off a string selection transistor. After discharging, as described above, a pass voltage Vpass is applied to the unselected word line, and a program voltage Vpgm is applied to the selected word line WLn.

FIG. 11 is a timing diagram schematically illustrating a program operation of a flash memory device shown in FIG. 9.

In a first interval t0 to t1, a ground voltage GND is provided to a selected bit line, and a power supply voltage Vdd is provided to an unselected bit line. The power supply voltage Vdd is applied to selected and unselected string selection lines. At this time, a channel of a string connected with the selected bit line has an initial channel voltage of 0 V, and a channel of a string connected with the unselected bit line has an initial channel voltage of (Vdd-Vth).

In a second interval t1 to t2, the selected string selection line maintains the power supply voltage Vdd, and the power supply voltage Vdd of the unselected string selection line is lowered to the ground voltage GND. At this time, all string selection transistors connected to the unselected string selection line are turned off.

In a third interval t2 to t3, a pass voltage Vpass is applied to all word lines, and channels of program-inhibited strings electrically shut off are boosted. Afterwards, a program voltage Vpgm is applied to the selected word line.

In a flash memory device, program disturbance when a program voltage is high is more severe than that when the program voltage is low. The flash memory device increases a program voltage Vpgm as program loops are iterated. To program memory cells that are not yet programmed, the flash memory device increases the program voltage Vpgm as program loops are iterated. This is referred to as "Incremental Step Pulse Program (ISPP)".

A program method described with reference to FIG. 9 may solve a difference between an initial channel voltage of a second program-inhibited string, connected with an unselected string selection line and a selected bit line, and an initial channel voltage of a third program-inhibited string, connected with the unselected string selection line and an unselected bit line, using a program loop characteristic.

The third program-inhibited string connected with the unselected string selection line may maintain an initial channel voltage of (Vdd-Vth) even though program loops are iterated. In contrast, a channel voltage of the second program-inhibited string connected with the unselected string selection line is 0 V at the beginning of the program loop and is changed into (Vdd-Vth) while the program loop is executed. The reason is that the power supply voltage Vdd is applied to the selected bit line for program inhibition if programming of a selected memory cell connected with the second program-inhibited string is completed. The program method described with reference to FIG. 9 may reduce program disturbance without lowering of performance of the flash memory device.

Figure 12:
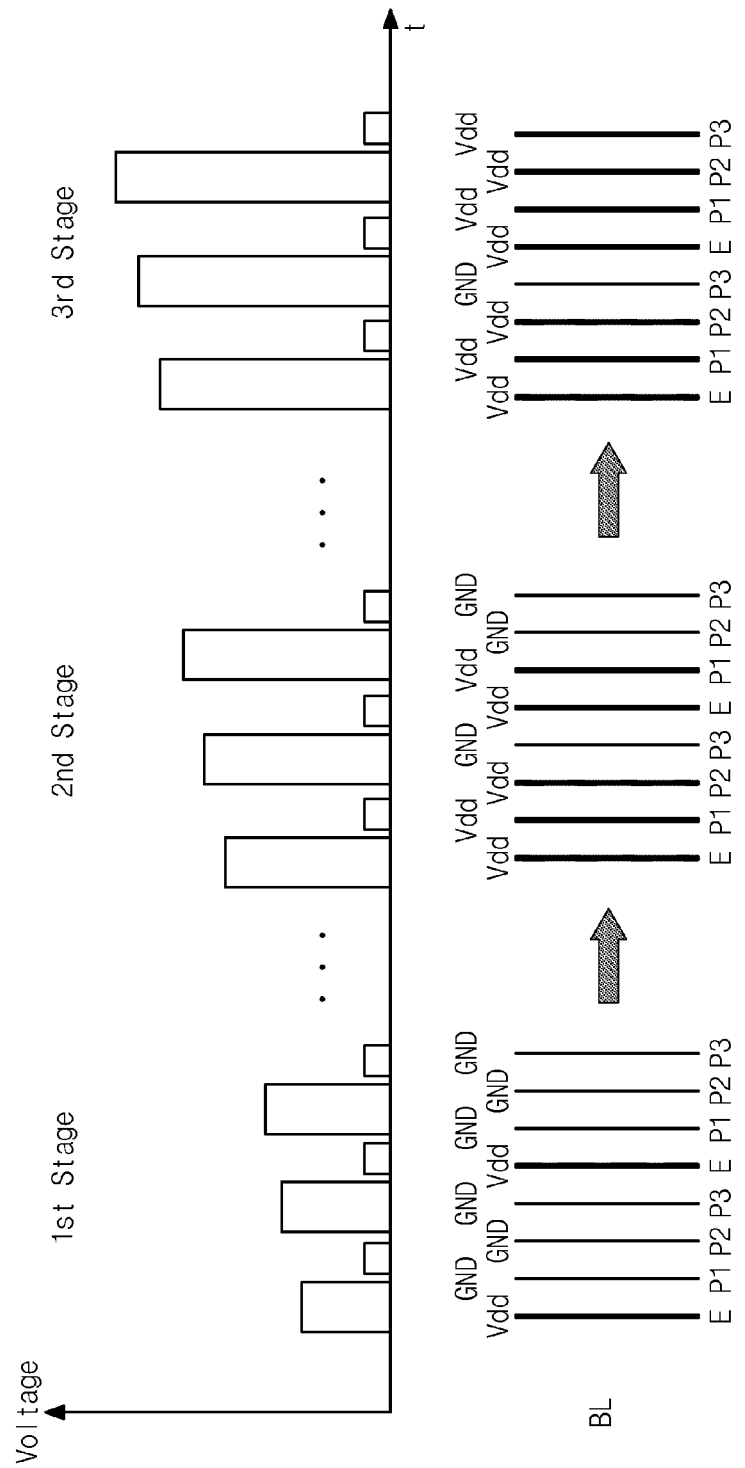
FIG. 12 is a graph schematically illustrating a voltage level variation of a bit line according to iteration of program loops.

FIG. 12 is a graph schematically illustrating a voltage level variation of a bit line according to iteration of program loops.

Referring to FIG. 12, a program loop is divided into first to third stages. It is assumed that memory cells have an erase state E and first to third program states P1 to P3. In FIG. 12, voltage levels of eight bit lines are illustrated under the assumption that each state is stored by two memory cells. A bit line denoted by a thin solid line has a ground voltage GND, and a bit line denoted by a thick solid line has a power supply voltage Vdd.

At the beginning of program loops (1$^{st}$ stage), the power supply voltage Vdd is applied to a bit line only connected to a memory cell maintaining the erase state E. That is, the power supply voltage Vdd is applied to two bit lines corresponding to the erase state E.

In the middle of the program loops ($2^{nd}$ stage), the power supply voltage Vdd is also applied to a bit line connected with a program-completed memory cell as the program loops are iterated. That is, if a result of a program verification operation indicates "pass", the power supply voltage Vdd may be applied to a relevant bit line for program inhibition. In FIG. 12, an embodiment of the application is exemplified as two memory cells having the first program state P1 and one memory cell having the second program state P2 are programmed to target states.

In the latter of the program loops ($3^{rd}$ stage), since most memory cells are programmed to target states, the power supply voltage Vdd is applied to most bit lines. In FIG. 12, an embodiment of the application is exemplified as all memory cells other than a memory cell to be programmed to the third program state P3 are programmed to target states.

Since a program voltage increases according to iteration of program loops, program disturbance may become more severe. However, as program loops are iterated, a voltage of a bit line is changed from the ground voltage GND to the power supply voltage Vdd. At this time, a program-inhibited string connected with an unselected string selection line has a channel voltage of (Vdd-Vth). The application may reduce program disturbance without lowering of performance of a flash memory device, using a phenomenon where most bit lines have the power supply voltage Vdd in the latter of the program loops ($3^{rd}$ stage) where the program disturbance is more severe.

It does not matter if bit lines rarely maintain the group voltage GND up to the last program loop. The reason is that such an error is corrected by an ECC.

Figure 13:
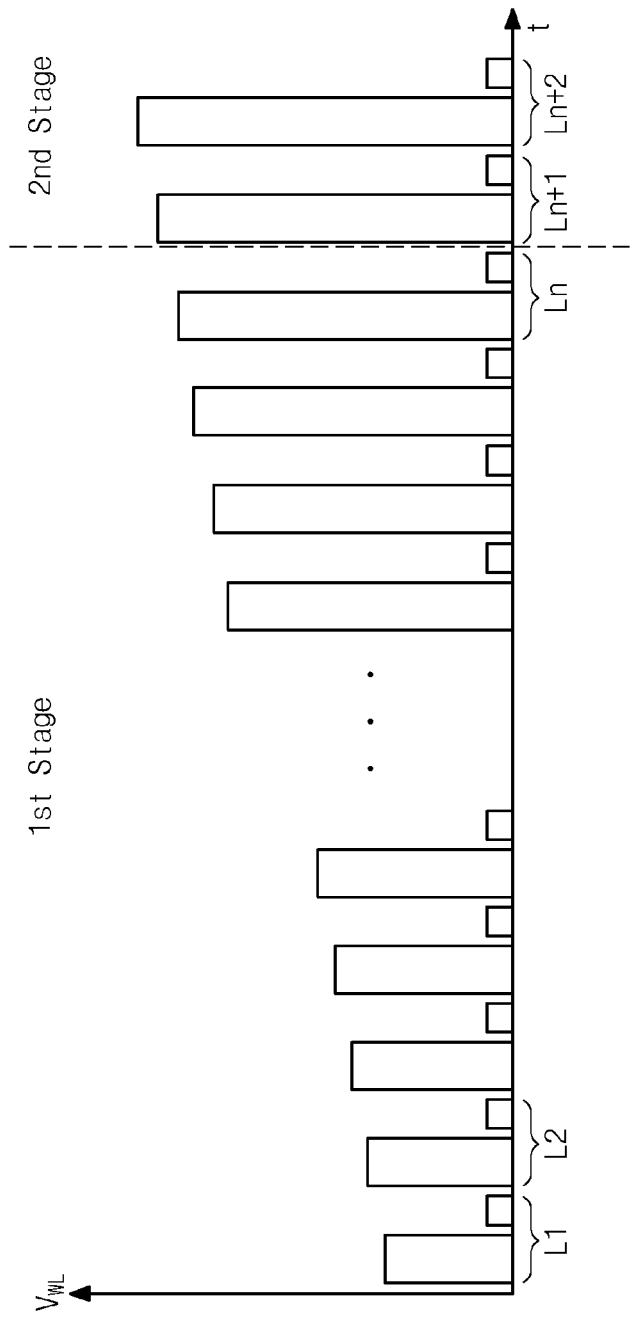
FIG. 13 is a graph schematically illustrating another embodiment of a voltage level variation of a bit line according to iteration of program loops.

FIG. 13 is a graph schematically illustrating another embodiment of a voltage level variation of a bit line according to iteration of program loops. Referring to FIG. 13, a method described with reference to FIG. 9 is executed in the beginning of program loops, and a method described with reference to FIG. 6 is executed in the latter of program loops.

For example, a program operating voltage applying method described with reference to FIG. 9 is applied to $1^{st}$-stage and $2^{nd}$-stage programming. That is, a ground voltage GND is provided to a selected bit line, and a power supply voltage Vdd is applied to an unselected bit line. The power supply voltage Vdd or a first voltage is provided to selected and unselected string selection lines. Before a program pulse is provided, a ground voltage GND or a second voltage may be provided to the unselected string selection line.

At this time, a channel of a string connected with the unselected string selection line is boosted. A program operating voltage applying method described with reference to FIG. 6 is applied to $3^{rd}$-stage programming. The power supply voltage Vdd is applied to selected and unselected bit lines, and the selected bit line is discharged such that it is set to the ground voltage GND. Accordingly, there is performed programming about a string connected with a selected bit line and a selected string selection line.

Referring to FIG. 13, it is assumed that a flash memory device 1100 performs first to n+$2^{nd}$ program loops L1 to Ln+2 at a program operation. In FIG. 13, an embodiment of the application is exemplified as program loops are divided into a first stage including $1^{st}$ to n-th program loops and a second stage including n+$1^{st}$ and n+$2^{nd}$ program loops. In the first stage L1 to Ln, programming of memory cells corresponding to most program states may be completed. In the second stage Ln+1 and Ln+2, memory cells having some upper program states may be programmed.

A flash memory device 1100 according to an exemplary embodiment of the application applies a program voltage condition described with reference to FIG. 9 to the first stage L1 to Ln and a program voltage condition described with reference to FIG. 6 to the second stage Ln+1 and Ln+2.

During each program loop of the first stage L1 to Ln, a ground voltage GND is applied to a selected bit line, a power supply voltage Vdd is applied to an unselected bit line, and the power supply voltage Vdd is applied to selected and unselected string selection lines. Next, the selected string selection line maintains the power supply voltage Vdd, while the power supply voltage Vdd of the unselected string selection line is lowered to the ground voltage GND (or the unselected string selection line is grounded). Then, a program voltage Vpgm is applied to a selected word line. In the first stage, program disturbance is reduced without lowering of performance of the flash memory device 1100.

In the second stage Ln+1 and Ln+2, channels of all strings are pre-charged with (Vdd-Vth) during an initial pre-charge section. Hence, a program method of the application may reduce program disturbance by setting channels of program-inhibited strings with the same initial channel voltage.

Figure 14:
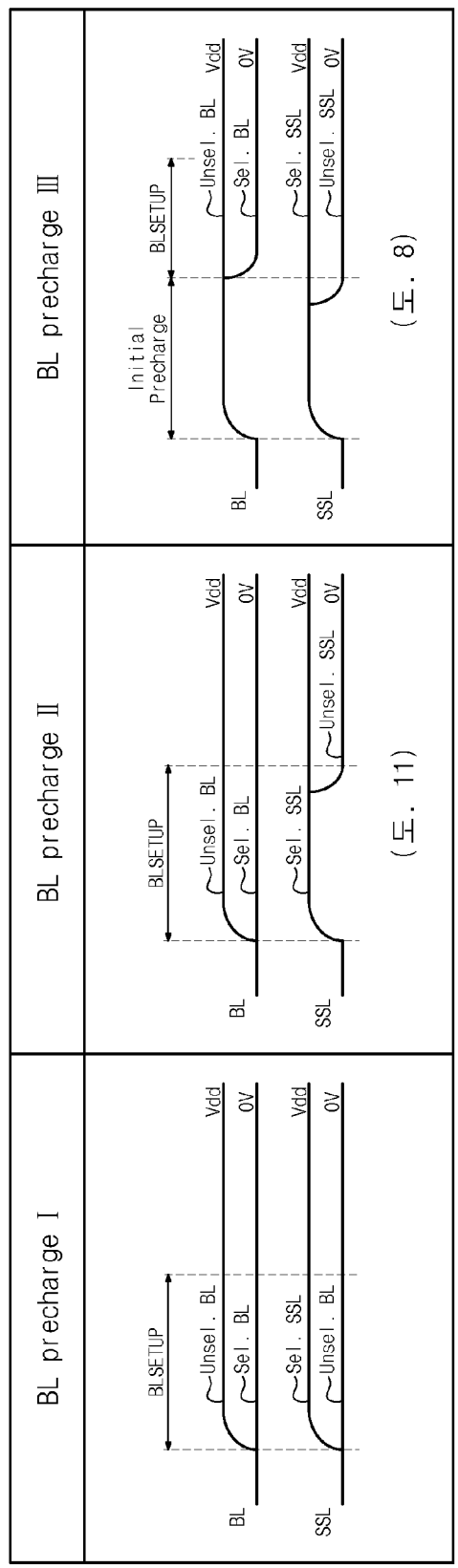
FIG. 14 is a diagram schematically illustrating a bit line pre-charge method at a program operation of a flash memory device shown in FIG. 2.

FIG. 14 is a diagram schematically illustrating a bit line pre-charge method at a program operation of a flash memory device shown in FIG. 2. Referring to FIG. 14, at a program operation, a flash memory device 1100 (refer to FIG. 2) may pre-charge bit lines using three methods, as described above.

A first bit line pre-charge method may include applying 0 V and a power supply voltage Vdd to a selected bit line and an unselected bit line and applying the power supply voltage Vdd to selected and unselected string selection lines.

A second bit line pre-charge method may include, as described with reference to FIG. 11, applying 0 V and a power supply voltage Vdd to a selected bit line and an unselected bit line, applying the power supply voltage Vdd to selected and unselected string selection lines, and applying 0 V to the unselected word line.

A third bit line pre-charge method may include, as described with reference to FIGS. 6 to 8, pre-charging channels of all cell strings with (Vdd-Vth) by applying a power supply voltage Vdd to selected/unselected bit lines and selected/unselected string selection lines and discharging voltages of the unselected string selection lines and the selected bit line to 0 V.

Figure 15:
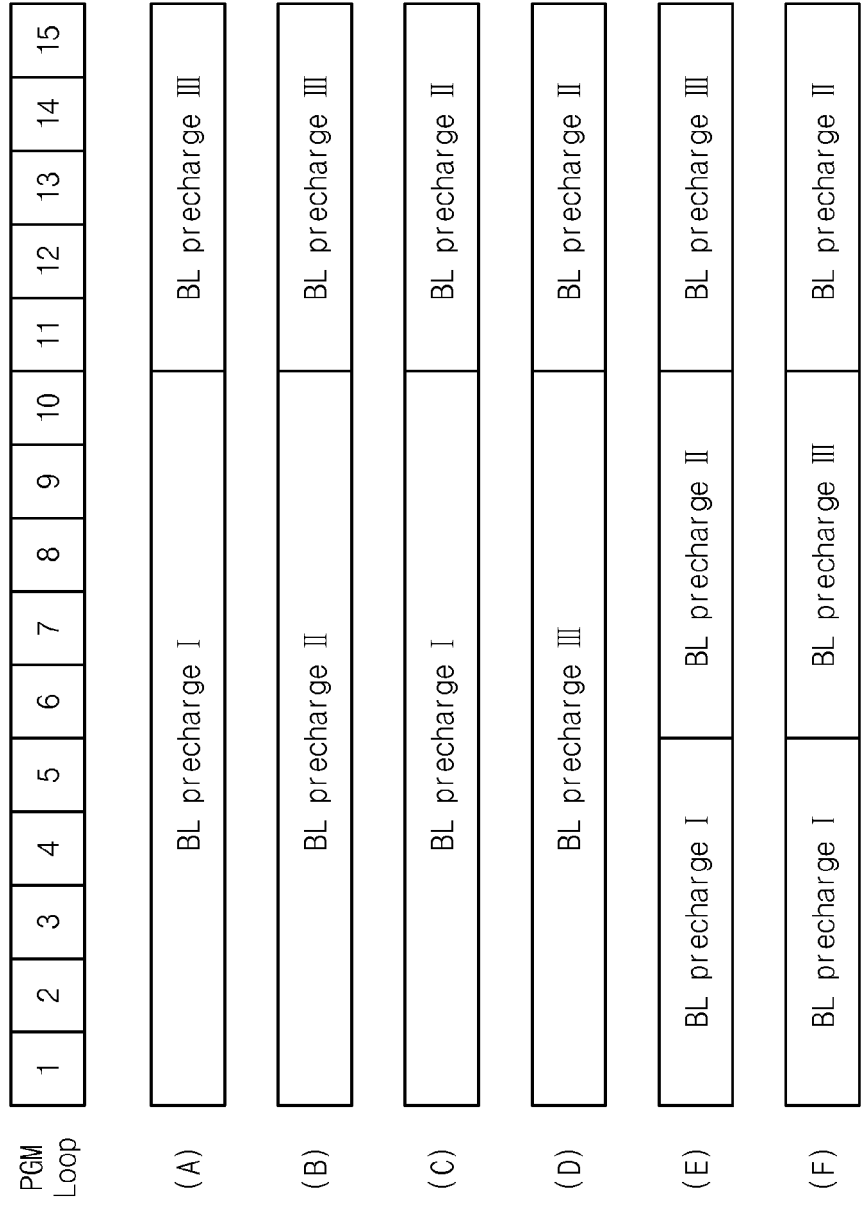
FIG. 15 is a diagram schematically illustrating a program method of a flash memory device according to an exemplary embodiment of the application.

FIG. 15 is a diagram schematically illustrating a program method of a flash memory device according to an exemplary embodiment of the application. In FIG. 15, an embodiment of the application is exemplified as the number of program loops is "15". However, the scope and spirit of the application may not be limited thereto. As program loops are iterated, a flash memory device 1100 according to an exemplary embodiment of the application may apply at least one of various bit line pre-charge methods to each program loop.

For example, referring to case (A) of FIG. 15, a first bit line pre-charge method is applied to first to tenth program loops, and a third bit line pre-charge method is applied to remaining program loops. Referring to case (B) of FIG. 15, a second bit line pre-charge method is applied to the first to tenth program loops, and the third bit line pre-charge method is applied to remaining program loops. A pre-charge scheme corresponding to the case (B) may be substantially the same as described with reference to FIG. 13. Referring to case (C) of FIG. 15, the first bit line pre-charge method is applied to the first to tenth program loops, and the second bit line pre-charge method is applied to remaining program loops. Referring to case (D) of FIG. 15, a third bit line pre-charge method is applied to the first to tenth program loops, and the second bit line pre-charge method is applied to remaining program loops.

Referring to case (E) and (F) of FIG. 15, the flash memory device 1100 according to an exemplary embodiment of the application may perform a program operation using the three pre-charge methods. That is, Referring to case (E) of FIG. 15, the first bit line pre-charge method is applied to the first to fifth program loops, the second bit line pre-charge method is applied to sixth to tenth program loops, and the third bit line pre-charge method is applied to remaining program loops. Referring to case (F) of FIG. 15, the first bit line pre-charge method is applied to the first to fifth program loops, the third bit line pre-charge method is applied to sixth to tenth program loops, and the second bit line pre-charge method is applied to remaining program loops. Here, the number of program loops and the number of bit line pre-charge methods may be only exemplary and may be various changed.

Returning to FIG. 2, a program operation of a flash memory device 1100 according to an exemplary embodiment of the application may be implemented through a program voltage manager 1165. The program voltage manager 1165 may manage voltages to be provided to a string selection line(s), a bit line(s), and a word line(s) at a program operation.

After a program recovery operation, the program voltage manager 1165 may reduce a channel voltage to a negative voltage. As a power supply voltage Vdd is provided to an unselected string selection line, the flash memory device 1100 may set an initial channel voltage level to a difference (Vdd-Vth) between the power supply voltage and a threshold voltage of a string selection transistor or to a difference between a first voltage and the threshold voltage of the string selection transistor, not to a negative voltage. The program voltage manager 1165 may improve efficiency of a boosting operation by setting voltages to be provided to a string selection line(s) and a bit line(s). In other words, the program voltage manager 1165 may improve data reliability by reducing an error occurrence probability.

Figure 16:
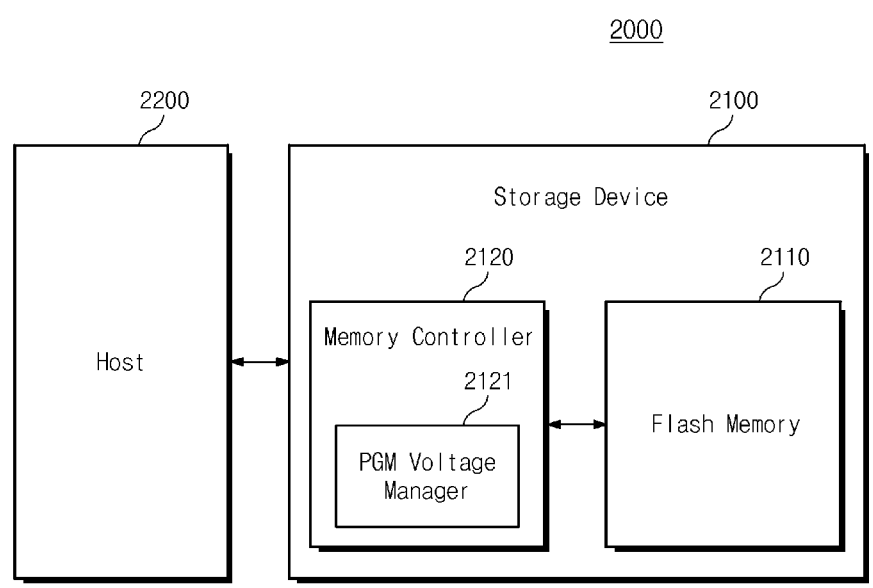
FIG. 16 is a block diagram schematically illustrating a flash memory system according to another exemplary embodiment of the application.

FIG. 16 is a block diagram schematically illustrating a flash memory system according to another exemplary embodiment of the application. Referring to FIG. 16, a flash memory system 2000 contains a storage device 2100 and a host 2200. The storage device 2100 includes a flash memory 2110 and a memory controller 2120.

The storage device 2100 may include a storage medium such as a memory card (for example SD, MMC, etc.) or a removable mobile storage device (e.g., a USB memory, etc.). The storage device 2100 is connected with the host 2200. The storage device 2100 exchanges data with the host 2200 through a host interface. The storage device 2100 is supplied with power from the host 2200 and performs an internal operation.

Referring to FIG. 16, a program voltage manager 2121 is implemented in the memory controller 2120. The program voltage manager 2121 may adjust voltages to be provided to a string selection line(s) and a bit line(s) based on a program loop at a program operation of the flash memory device 2100.

The program voltage manager 2121 may select a program voltage applying method above described. Under management of the program voltage manager 2121, a power supply voltage Vdd is applied to a string selection line(s) and an unselected bit line(s), and a ground voltage (e.g., 0 V) is applied to a selected bit line(s). Under management of the program voltage manager 2121, the power supply voltage Vdd or a first voltage of the unselected string selection line(s) is discharged to a second voltage, and a program voltage is provided to a selected word line. The second voltage may be a ground voltage (e.g., 0 V) or a voltage that is sufficient to turn off a string selection transistor.

Since the power supply voltage or the first voltage is provided to an unselected string selection line(s), program disturbance and error occurrence probability are reduced at a program operation, thereby improving data reliability.

Figure 17:
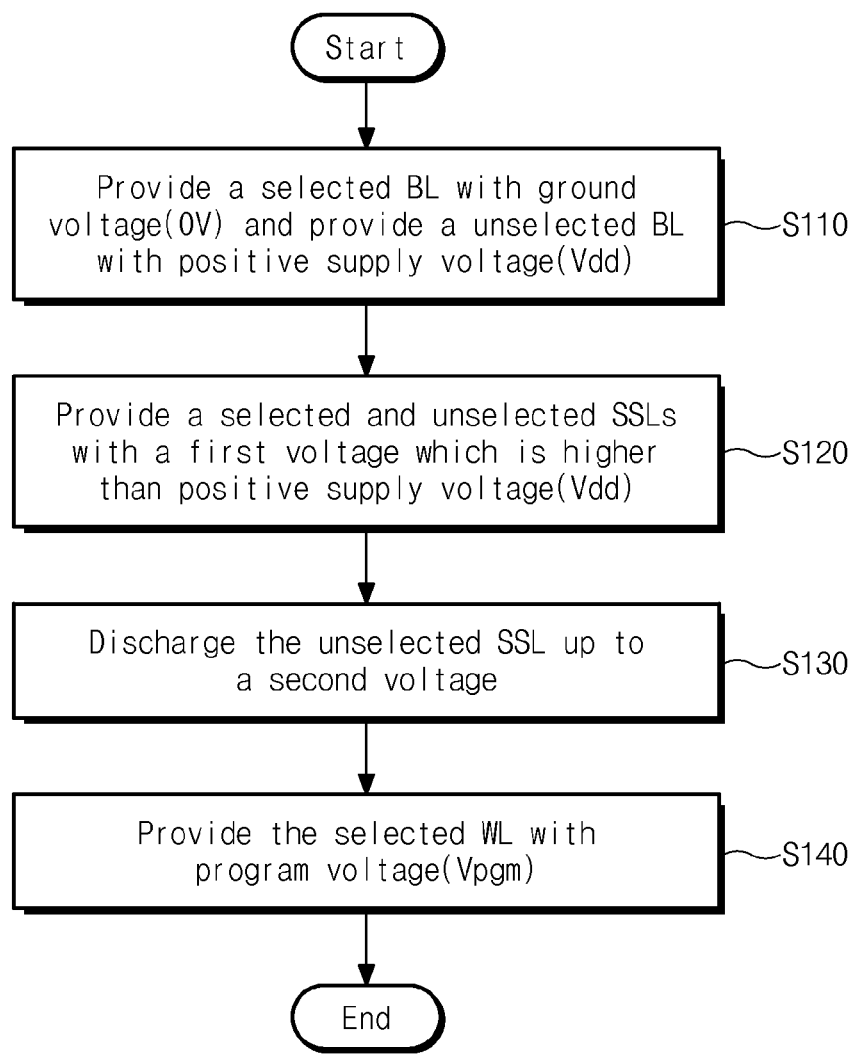
FIG. 17 is a flow chart for describing an operating method of a program voltage manager shown in FIGS. 1 and 16.

FIG. 17 is a flow chart for describing an operating method of a program voltage manager shown in FIGS. 1 and 16. Below, an operating method of a program voltage manager 1165 shown in FIG. 1 will be more fully described. The operating method of the program voltage manager 1165 may be applied to that of a program voltage manager 2121 shown in FIG. 16. The program voltage manager 1165 may determine voltages to be provided to a bit line(s) and a string selection line(s) at a program operation.

In step S110, the program voltage manager 1165 allows a ground voltage (e.g., 0 V) to be provided to a selected bit line and a power supply voltage Vdd to be provided to an unselected bit line.

In step S120, the program voltage manager 1165 allows a first voltage to be provided to selected and unselected string selection lines. Here, the first voltage may be a voltage higher than the power supply voltage Vdd.

In step S130, the program voltage manager 1165 allows the first voltage of the unselected string selection line to be discharged to a second voltage before a program voltage is applied to a selected word line. Here, the second voltage may be a ground voltage or a voltage that is sufficient to turn off a string selection transistor.

In step S140, the program voltage manager 1165 allows the program voltage to be provided to the selected word line. That is, programming of the selected word line may be executed.

Figure 18:
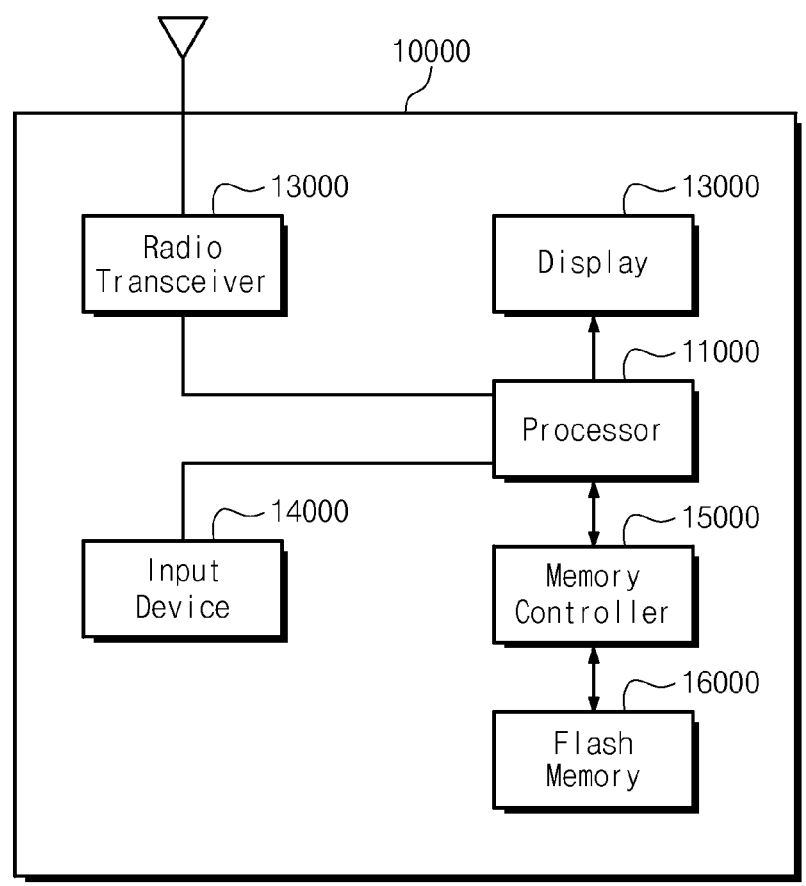
FIG. 18 is a block diagram schematically illustrating an electronic device including a memory controller and a nonvolatile memory device according to an embodiment of the application.

FIG. 18 is a block diagram schematically illustrating an electronic device including a memory controller and a nonvolatile memory device according to an embodiment of the application.

Referring to FIG. 18, an electronic device 10000 such as a cellular phone, a smart phone, or a tablet PC contains a nonvolatile memory device 16000 implemented by a flash memory device and a memory controller 15000 to control the nonvolatile memory device 16000.

The nonvolatile memory device 16000 is a nonvolatile memory device shown in FIG. 1. The nonvolatile memory device 16000 may store random data. The memory controller 15000 is controlled by a processor 11000 that controls an overall operation of the electronic device 10000. Data stored at the nonvolatile memory device 16000 is displayed through a display 13000 according to a control of the memory controller 15000 that operates according to a control of the processor 11000.

A radio transceiver 12000 exchanges a radio signal through an antenna. For example, the radio transceiver 12000 converts a radio signal received through the antenna into a signal capable of being processed by the processor 11000. Accordingly, the processor 11000 processes a signal from the radio transceiver 12000 and stores the processed signal in the nonvolatile memory device 16000. Alternatively, the processor 11000 displays the processed signal through the display 13000. The radio transceiver 12000 converts a signal output from the processor 11000 and outputs the converted signal to the external device through the antenna.

An input device 14000 is a device that receives a control signal for controlling an operation of the processor 11000 or data to be processed by the processor 11000, and is implemented by a pointing device such as a touch pad or a computer mouse, a key pad, or a keyboard.

The processor 11000 controls the display 13000 such that data from the nonvolatile memory device 16000, a radio signal from the radio transceiver 12000 or data from the input device 14000 is displayed through the display 13000.

Figure 19:
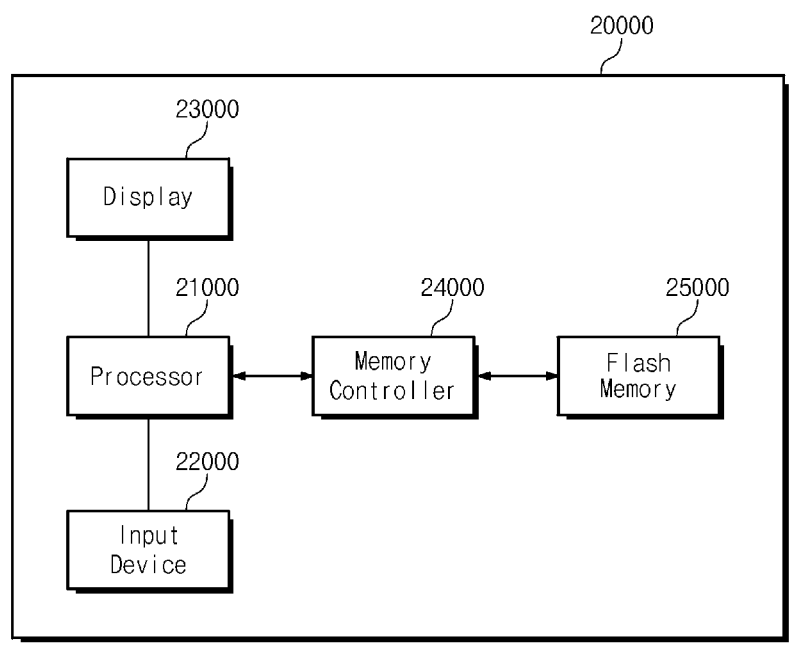
FIG. 19 is a block diagram schematically illustrating an electronic device including a memory controller and a nonvolatile memory device, according to another embodiment of the application.

FIG. 19 is a block diagram schematically illustrating an electronic device 20000 including a memory controller 24000 and a nonvolatile memory device 25000, according to another embodiment of the application.

Referring to FIG. 19, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player. The electronic device 20000 includes a nonvolatile memory device 25000 (e.g., a flash memory device) and a memory controller 24000 to control an operation of the nonvolatile memory device 25000.

The electronic device 20000 includes a processor 21000 that controls an overall operation of the electronic device 20000. The memory controller 24000 is controlled by the processor 21000. The processor 21000 displays data stored at the nonvolatile memory device 25000 through a display 23000 according to an input signal generated by an input device 22000. For example, the input device 22000 is implemented with a pointing device such as a touch pad or a computer mouse, a key pad, or a keyboard.

Figure 20:
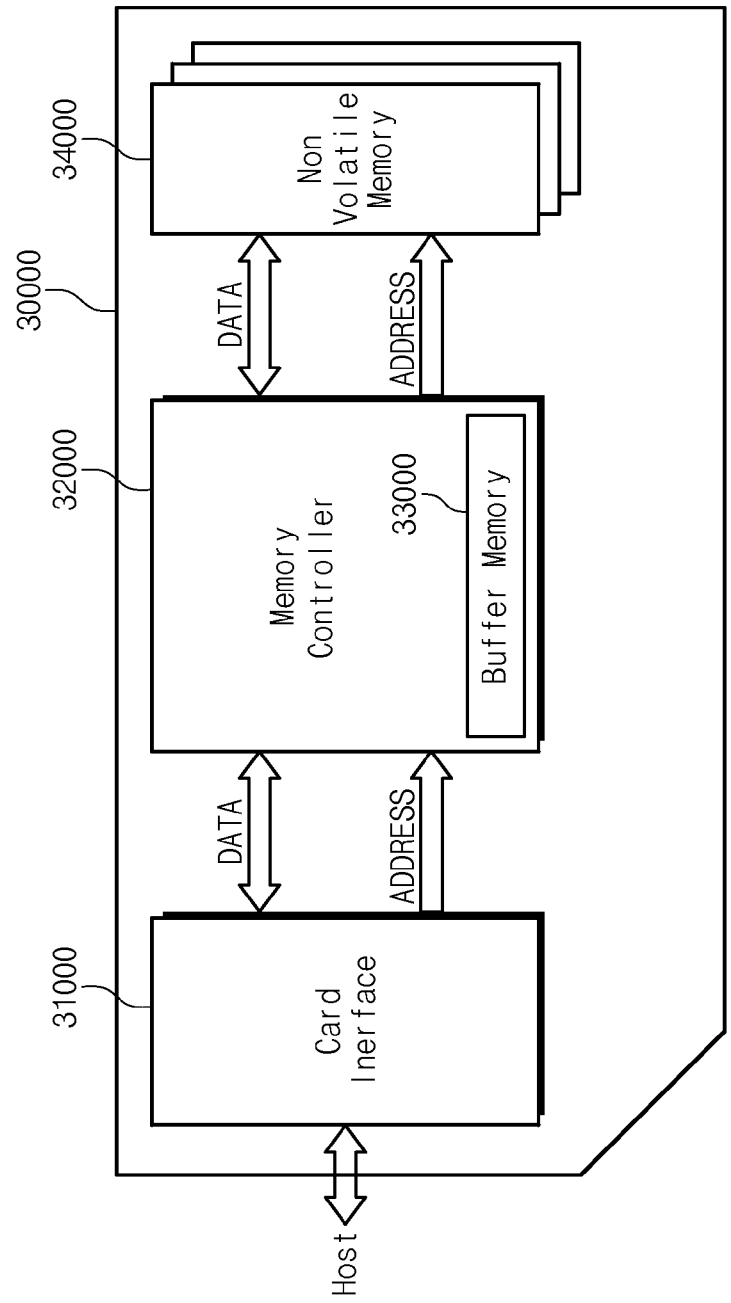
FIG. 20 is a block diagram schematically illustrating an electronic device including a nonvolatile memory device, according to still another embodiment of the application.

FIG. 20 is a block diagram schematically illustrating an electronic device 30000 including a nonvolatile memory device 34000, according to still another embodiment of the application. Referring to FIG. 20, an electronic device 30000 includes a card interface 31000, a memory controller 32000, and a nonvolatile memory device 34000 (e.g., a flash memory device). The electronic device 30000 exchanges data with a host through the card interface 31000.

In exemplary embodiments, the card interface 31000 may be an SD (Secure Digital) card interface or an MMC (Multi-Media Card) interface. However, the scope and spirit of the application may not be limited thereto. The card interface 31000 permits data to be exchanged between the host and the memory controller 32000 according to the communications protocol of the host capable of communicating with the electronic device 30000.

The memory controller 32000 controls an overall operation of the electronic device 30000 and control data exchange between the card interface 31000 and the nonvolatile memory device 34000. A buffer memory 33000 of the memory controller 32000 buffers data transferred between the card interface 31000 and the nonvolatile memory device 34000.

The memory controller 32000 is connected to the card interface 31000 and the nonvolatile memory device 34000 through a data bus DATA and an address bus ADDRESS. In exemplary embodiments, the memory controller 32000 receives an address of data to be read or written from the card interface 31000 through the address bus ADDRESS and sends it to the nonvolatile memory device 34000.

Also, the memory controller 32000 receives or transfers data to be read or written through the data bus DATA connected to the card interface 31000 or the nonvolatile memory device 34000. The nonvolatile memory device 16000 may be a flash memory device shown in FIG. 1. The nonvolatile memory device 16000 may store random data.

When the electronic device 30000 is connected to a host such as a PC, a tablet PC, a digital camera, a digital audio player, a mobile phone, console video game hardware or a digital set-top box, the host may exchange data stored at the nonvolatile memory device 34000 through the card interface 31000 and the memory controller 32000.

Figure 21:
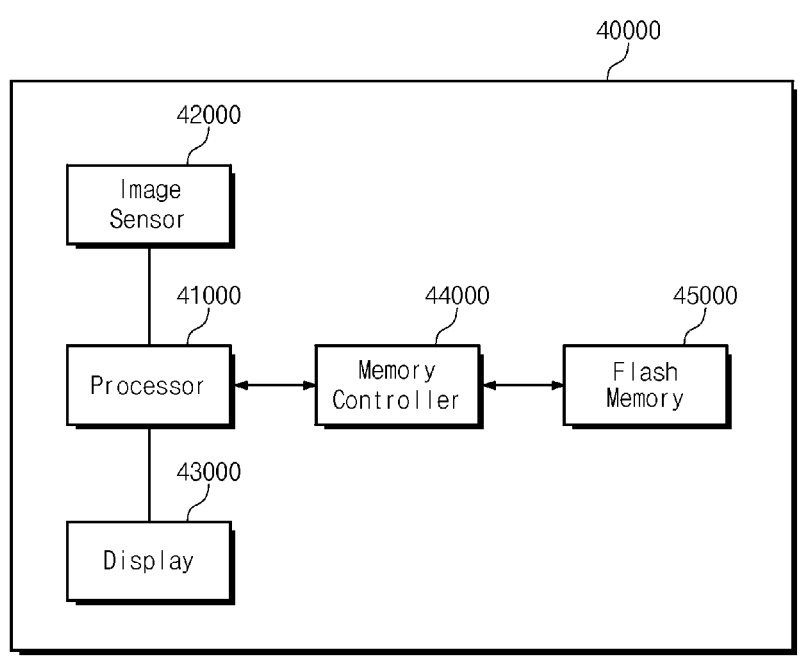
FIG. 21 is a block diagram schematically illustrating an electronic device including a memory controller and a nonvolatile memory device, according to a further embodiment of the application.

FIG. 21 is a block diagram schematically illustrating an electronic device including a memory controller and a nonvolatile memory device, according to a further embodiment of the application.

Referring to FIG. 21, an electronic device 40000 includes a nonvolatile memory device 45000 (e.g., a flash memory device), a memory controller 44000 to control a data processing operation of the nonvolatile memory device 45000, and a processor 41000 to control an overall operation of the electronic device 40000.

The nonvolatile memory device 45000 is a nonvolatile memory device shown in FIG. 1 or 2. An image sensor 42000 of the electronic device 40000 converts an optical signal into a digital signal, and the converted digital signal is stored at the nonvolatile memory device 45000 under a control of the processor 41000. Also, the converted digital signal is displayed through a display 43000 under a control of the processor 41000.

Figure 22:
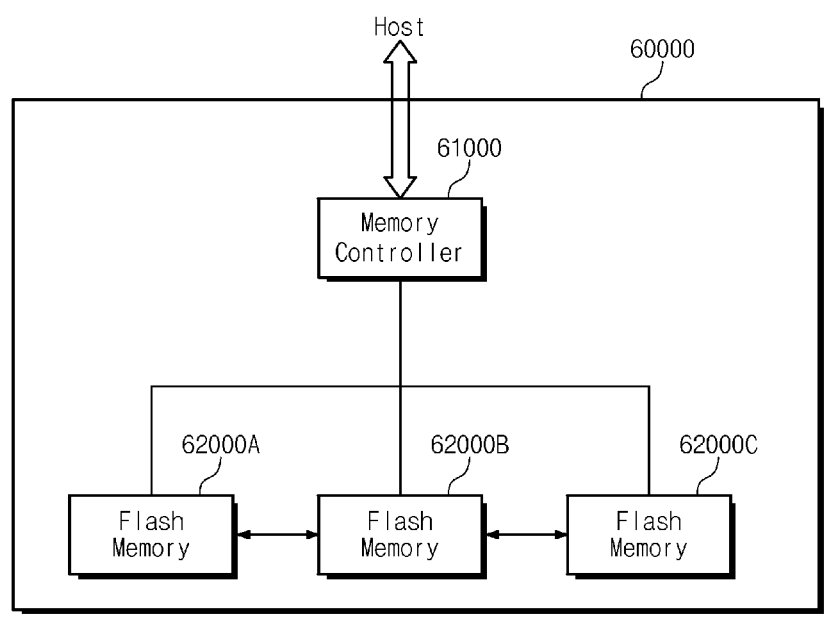
FIG. 22 is a block diagram schematically illustrating an electronic device including a memory controller and nonvolatile memory devices, according to yet another embodiment of the application.

FIG. 22 is a block diagram schematically illustrating an electronic device 60000 including a memory controller 61000 and nonvolatile memory devices 62000A, 62000B, and 62000C, according to yet another embodiment of the application. Referring to FIG. 22, an electronic device 60000 is implemented with a data storage device such as a solid state drive (SSD).

The electronic device 60000 includes nonvolatile memory devices 62000A, 62000B, and 62000C and a memory controller 61000 to control a data processing operation of each of the nonvolatile memory devices 62000A, 62000B, and 62000C.

The electronic device 60000 is implemented with a memory system or a memory module.

Each of the nonvolatile memory devices 62000A, 62000B, and 62000C is a nonvolatile memory device shown in FIG. 1 or 2. Each of the nonvolatile memory devices 62000A, 62000B, and 62000C may store random data. The memory controller 61000 is implemented outside or inside electronic device 60000 according to embodiments.

Figure 23:
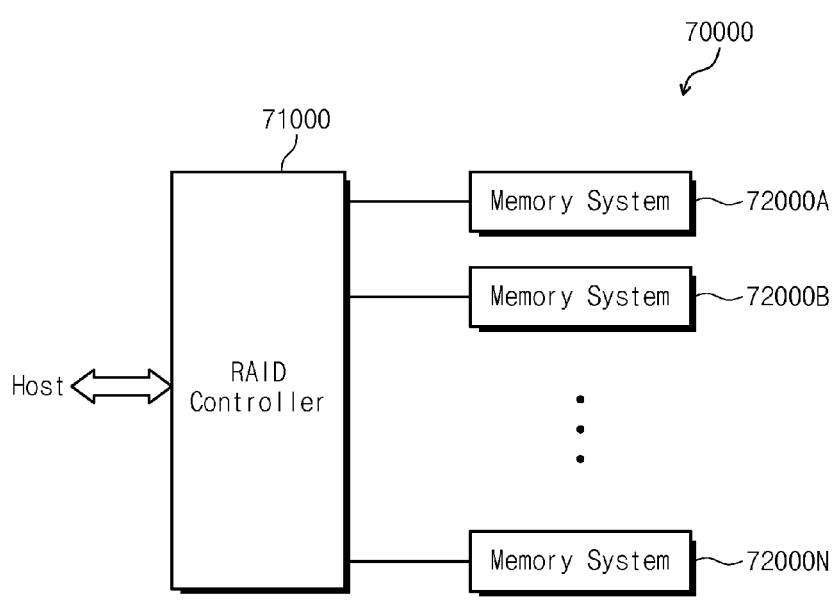
FIG. 23 is a block diagram schematically illustrating a data processing system including an electronic device illustrated in FIG. 22.

FIG. 23 is a block diagram schematically illustrating a data processing system including an electronic device illustrated in FIG. 22. Referring to FIGS. 22 and 23, a data storage device 70000 is implemented with a RAID (Redundant Array of Independent Disks) system. The data storage device 70000 includes a RAID controller 71000 and a plurality of memory systems 72000A to 72000N (N being a natural number).

The memory systems 72000A to 72000N constitute a RAID array. The data storage device 70000 is implemented with a personal computer or an SSD.

During a program operation, the RAID controller 71000 outputs program data output from a host to one of the memory systems 72000A to 72000N according to one, selected based on RAID level information output from the host, from a plurality of RAID levels.

During a read operation, the RAID controller 71000 provides the host with data read from one of the memory systems 72000A to 72000N according to one, selected based on RAID level information output from the host, from a plurality of RAID levels.

As described above, an error occurrence probability may be reduced at a program operation, thereby improving data reliability.

While the application has been described with reference to exemplary embodiments, it will be apparent to those skilled in the art that various changes and modifications may be made without departing from the spirit and scope of the application. Therefore, it should be understood that the above embodiments are not limiting, but illustrative.

What is claimed is:

1. A nonvolatile memory device which includes memory cells stacked in a direction perpendicular to a substrate, the device comprising:
a first memory cell string connected to a selected bit line and a selected string selection line;
a second memory cell string connected to the selected bit line and an unselected string selection line; and
a third memory cell string connected to an unselected bit line,
wherein during an initial precharge section of a program operation, a turn on voltage is initially applied to the unselected string selection line, the selected string selection line, and the selected and unselected bit lines, and
during a bit line setup section of the program operation following the initial precharge section, a bit line program voltage is applied to the selected bit line, and the turn-on voltage provided to the unselected string selection line is changed to a turn-off voltage.

2. The nonvolatile memory device of claim 1, further comprising:
a word line electrically connected to selected memory cells,
wherein a voltage of the unselected string selection line is discharged to a ground voltage before a program voltage is applied to the word line.

3. The nonvolatile memory device of claim 2, wherein the bit line program voltage applied to the selected bit line is maintained to the ground voltage before the program voltage is applied to the word line.

4. The nonvolatile memory device of claim 1, wherein during the bit line setup section, a program inhibit voltage is applied to the unselected bit line.

5. The nonvolatile memory device of claim 1, wherein the turn-on voltage is sufficient to turn on a string selection transistor connected to the unselected string selection line.

6. The nonvolatile memory device of claim 5, wherein the turn-on voltage is a power supply voltage.

7. The nonvolatile memory device of claim 1, wherein the turn-off voltage is sufficient to turn off a string selection transistor connected to the unselected string selection line.

8. The nonvolatile memory device of claim 7, wherein the turn-off voltage is a ground voltage.

9. The nonvolatile memory device of claim 1, wherein the nonvolatile memory device includes at least one flash memory having a three-dimensional structure in which memory cells are stacked in a direction perpendicular to the substrate.

10. A program method of a nonvolatile memory device which includes a first memory cell string connected to a selected bit line and a selected string selection line; a second memory cell string connected to the selected bit line and an unselected string selection line; and a third memory cell string connected to an unselected bit line, the program method comprising:
performing an initial precharge and then a first bit line setup of a program operation in at least one program loop among a plurality of program loops, wherein during the initial precharge, a turn-on voltage is initially applied to the unselected string selection line, the selected string selection line, and selected and unselected bit line, and during the first bit line setup, a bit line program voltage is applied to the selected bit line, and the turn-on voltage provided to the unselected string selection line is changed to a turn-off voltage; and
performing a second bit line setup of the program operation in at least one other program loop among the plurality of program loops, wherein during the second bit line setup of the program operation, a pre-charge voltage is applied to the selected bit line and the unselected bit line, the turn-on voltage is applied to the selected string selection line and the unselected string selection line, and then the turn-off voltage is applied to the unselected string selection line and the selected bit line.

11. The program method of claim 10, wherein the nonvolatile memory device comprises a word line electrically connected to selected memory cells, wherein during the first bit line setup, a voltage of the unselected string selection line is discharged to a ground voltage before a program voltage is applied to the word line.

12. The program method of claim 11, wherein during the first bit line setup, the bit line program voltage applied to the selected bit line is maintained to the ground voltage before the program voltage is applied to the word line.

13. The program method of claim 11, wherein during the second bit line setup, a voltage of the selected bit line and the unselected bit line is pre-charged to a program inhibit voltage, and then a voltage of the selected bit line is discharged to the bit line program voltage before the program voltage is applied to the word line.

14. The program method of claim 13, wherein the program inhibit voltage is a power supply voltage and the bit line inhibit voltage is the ground voltage.

15. The program method of claim 14, wherein during the second bit line setup, the selected bit line is discharged to the ground voltage after the unselected string selection line is grounded.

16. The program method of claim 10, wherein the at least one other program loop among the plurality of program loops is performed after the at least one program loop is performed.

17. The program method of claim 10, wherein the at least one program loop among the plurality of program loops is performed after the at least one other program loop is performed.

18. A program method of a nonvolatile memory device which includes a first memory cell string connected to a selected bit line and a selected string selection line; a second memory cell string connected to the selected bit line and an unselected string selection line; and a third memory cell string connected to an unselected bit line, the program method comprising:
performing an initial precharge and then a bit line setup of a program operation in at least one first program loop among a plurality of program loops,
wherein during the initial precharge, a turn-on voltage is initially applied to the unselected string selection line, the selected string selection line, and the selected and unselected bit lines, and during the bit line setup, a bit line program voltage is applied to the selected bit line, and the turn-on voltage provided to the unselected string selection line is changed to a turn-off voltage.

19. The program method of claim 18, wherein the nonvolatile memory device comprises a word line electrically connected to selected memory cells, wherein during the bit line setup, a voltage of the unselected string selection line is discharged to a ground voltage before a program voltage is applied to the word line.

20. The program method of claim 19, wherein during the bit line setup, the bit line program voltage applied to the selected bit line is maintained to the ground voltage before the program voltage is applied to the word line.

21. The program method of claim 18, further comprising:
performing a second bit line setup of the program operation in at least one second program loop, differing from the at least one first program loop, among the plurality of program loops,
wherein during the second bit line setup, the turn-on voltage is applied to the selected string selection line and the unselected bit line, and the turn-off voltage is applied to the unselected string selection line and the selected bit line.

22. The program method of claim 21, wherein the at least one first program loop among the plurality of program loops is performed after the at least one second program loop is performed.

23. The program method of claim 21, further comprising:
performing a third bit line setup of the program operation in at least one third program loop, differing from the at least one first and second program loops, among the plurality of program loops,
wherein during the third bit line setup, a pre-charge voltage is applied to the selected bit line and the unselected bit line, the turn-on voltage is applied to the selected string selection line and the unselected string selection line, and then the turn-off voltage is applied to the unselected string selection line and the selected bit line.

24. The program method of claim 23, wherein the at least one first program loop among the plurality of program loops is performed after the at least second program loop is performed, and then the at least one third program loop is performed.

25. The program method of claim 23, wherein the at least one first program loop among the plurality of program loops is performed after the at least one third program loop is performed, and then the at least one second program loop is performed.

26. A storage device, comprising:
a nonvolatile memory device including a first memory cell string connected between a selected bit line and a selected string selection line, a second memory cell string connected between the selected bit line and an unselected string selection line, and a third memory cell string connected to an unselected bit line; and
a memory controller configured to control the nonvolatile memory device,
wherein the nonvolatile memory device performs a bit line setup of a program operation in at least one first program loop among a plurality of program loops, wherein during the bit line setup, a bit line program voltage is provided to the selected bit line, and a turn-on voltage is provided to the unselected string selection line during a first part of the bit line setup and is discharged to a turn-off voltage during a second part of the bit line set up.

27. The storage device of claim 26, wherein the nonvolatile memory device has a three-dimensional structure in which memory cells are stacked in a direction perpendicular to a substrate.

28. The storage device of claim 26, wherein the nonvolatile memory device further performs a second bit line setup of the program operation in at least one second program loop, differing from the at least one first program loop, among the plurality of program loops, wherein during the second bit line setup of the program operation, a pre-charge voltage is applied to the selected bit line and the unselected bit line, the turn-on voltage is applied to the selected string selection line and the unselected string selection line, and then the turn-off voltage is applied to the unselected string selection line and the selected bit line.

29. The storage device of claim 28, wherein the nonvolatile memory device further performs a third bit line setup of the program operation in at least one third program loop, differing from the at least one first and second program loops, among the plurality of program loops, wherein during the third bit line setup, the turn-on voltage is applied to the selected string selection line and the unselected bit line, and the turn-off voltage is applied to the unselected string selection line and the selected bit line.

30. The storage device of claim 29, wherein the memory controller controls bit line setup operations of the plurality of program loops.

* * * * *